(12) United States Patent
Wang et al.

(10) Patent No.: US 10,955,451 B2
(45) Date of Patent: Mar. 23, 2021

(54) TESTING DEVICE, TESTING SYSTEM, AND TESTING METHOD

(71) Applicant: ASE TEST, INC., Kaohsiung (TW)

(72) Inventors: Yen-Chun Wang, Kaohsiung (TW);
Hung-Jen Huang, Kaohsiung (TW);
Chen-Kuo Chu, Kaohsiung (TW);
I-Chun Liu, Kaohsiung (TW)

(73) Assignee: ASE TEST, INC., Kaohsiung (TW)

(*) Notice: Subject to any disclaimer, the term of this patent is extended or adjusted under 35 U.S.C. 154(b) by 121 days.

(21) Appl. No.: 16/184,879

(22) Filed: Nov. 8, 2018

(65) Prior Publication Data

US 2019/0162767 A1 May 30, 2019

Related U.S. Application Data

(60) Provisional application No. 62/591,674, filed on Nov. 28, 2017.

(51) Int. Cl.
| | |
|---|---|
| *G01R 29/10* | (2006.01) |
| *G01R 31/00* | (2006.01) |
| *G01R 1/04* | (2006.01) |
| *G01R 31/28* | (2006.01) |
| *G01R 31/302* | (2006.01) |

(52) U.S. Cl.
CPC ........... *G01R 29/105* (2013.01); *G01R 1/045* (2013.01); *G01R 31/002* (2013.01); *G01R 31/2822* (2013.01); *G01R 31/3025* (2013.01)

(58) Field of Classification Search
USPC .............................. 324/612, 756.01, 756.02
See application file for complete search history.

(56) References Cited

U.S. PATENT DOCUMENTS

| | | | |
|---|---|---|---|
| 7,915,909 B2 | 3/2011 | Dunn et al. | |
| 2009/0153158 A1* | 6/2009 | Dunn ................ | G01R 31/2822 324/762.01 |
| 2014/0203829 A1* | 7/2014 | Yamada ............. | G01R 31/2863 324/750.08 |
| 2015/0015294 A1* | 1/2015 | Tan .................... | G01R 1/06716 324/756.02 |
| 2015/0048980 A1* | 2/2015 | Chin .................. | G01R 1/045 343/703 |
| 2015/0168486 A1* | 6/2015 | Isaac ................. | G01R 31/2834 324/756.02 |
| 2017/0102409 A1* | 4/2017 | Sarhad .............. | G01R 31/2822 |

* cited by examiner

*Primary Examiner* — Tung X Nguyen
*Assistant Examiner* — Robert P Alejnikov, Jr.
(74) *Attorney, Agent, or Firm* — Foley & Lardner LLP

(57) ABSTRACT

A testing device includes a testing socket, a first transmission medium and a second transmission medium. The testing socket defines a radiation space. The first transmission medium is disposed in the radiation space of the testing socket. The first transmission medium is configured for supporting a device under test (DUT). The second transmission medium is disposed in the radiation space of the testing socket.

32 Claims, 26 Drawing Sheets

TESTING DEVICE, TESTING SYSTEM, AND TESTING METHOD

CROSS-REFERENCE TO RELATED APPLICATIONS

This application claims the benefit of and priority to U.S. Provisional Patent Application 62/591,674, filed on Nov. 28, 2017, which is incorporated herein by reference in its entirety.

BACKGROUND

1. Field of the Disclosure

The present disclosure relates to a testing device, a testing system, and a testing method, and to a testing device, a testing system, and a testing method used to test a wireless module using a non-contact technique.

2. Description of the Related Art

A wireless module (e.g., an mmWave RF wireless module) may be tested over the air (OTA). Such testing may be performed in a testing room (or a testing chamber), in which a plurality of absorbers are disposed (e.g. on inner surfaces thereof). Such a testing room (or testing chamber) can be large. For example, a size thereof may be 6 meters (m)*6 m*6 m, or 60 centimeters (cm)*60 cm*60 cm. In addition, such testing may take a long time. Therefore, such testing may be unsuitable for testing devices as part of a mass production process.

SUMMARY

According to one aspect, in some embodiments, a testing device includes a testing socket, a first transmission medium and a second transmission medium. The testing socket defines a radiation space. The first transmission medium is disposed in the radiation space of the testing socket. The first transmission medium is configured for supporting a device under test (DUT). The second transmission medium is disposed in the radiation space of the testing socket.

According to another aspect, in some embodiments, a testing device includes a testing socket and a device holder. The testing socket has an inner surface defining a radiation space. The inner surface of the testing socket is a wave absorbing surface. The device holder is disposed in the radiation space of the testing socket. The device holder defines an radiation space for receiving a device under test (DUT).

According to another aspect, in some embodiments, a testing system includes a testing device, a circuit board, a tester and a sub-system. The testing device includes a testing socket, a first transmission medium and a second transmission medium. The testing socket defines a radiation space. The first transmission medium is disposed in the radiation space of the testing socket. The first transmission medium is configured for supporting a device under test (DUT). The second transmission medium is disposed in the radiation space of the testing socket. The circuit board is disposed above the testing socket and configured to electrically connect to the DUT. The tester is disposed under the testing socket and electrically connected to the circuit board. The sub-system includes an intermediate apparatus and an up/down converter. The intermediate apparatus is in communication with the device under test. The up/down converter is electrically connected to the intermediate apparatus and the tester. The up/down converter is configured for lowering or raising a frequency of a signal.

According to another aspect, in some embodiments, a testing method includes: (a) providing a test board and a device under test (DUT), the device under test (DUT) including a first surface and a second surface opposite the first surface and a plurality of electrical contacts disposed adjacent to the first surface; (b) applying suction on the first surface of the device under test (DUT) so that the electrical contacts of the DUT are electrically connected to the test board; and (c) providing a sub-system, wherein the sub-system includes an intermediate apparatus and an up/down converter, the intermediate apparatus is in communication with the device under test (DUT), the up/down converter is electrically connected to the intermediate apparatus and a tester, and the up/down converter is used for lowering or raising a frequency of a signal.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
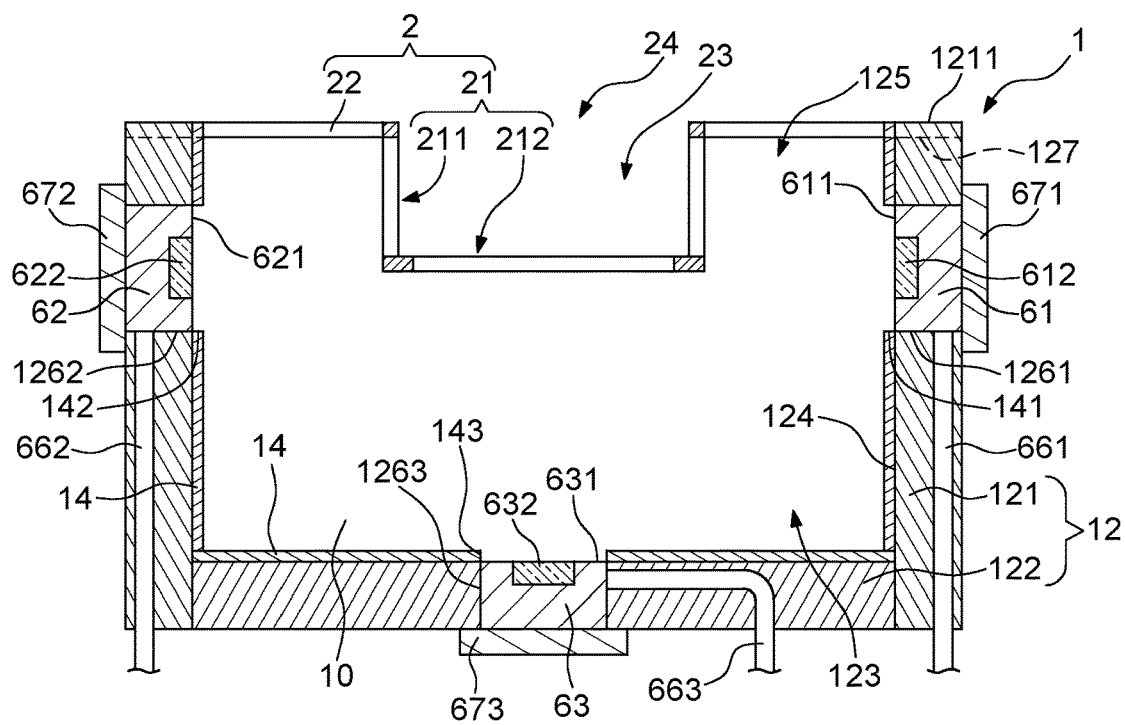
FIG. 1 illustrates a cross-sectional view of a testing device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description provided herein may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples provided herein. This repetition is for the purpose of simplicity and clarity and does not in itself dictate a relationship between the various embodiments and/or configurations discussed.

In a comparative testing process, a DUT may have a first surface and a second surface opposite to the first surface. The DUT may include a plurality of solder bumps and an antenna. The solder bumps may be disposed on the first surface, and the antenna may be disposed on the second surface. During the testing process, a testing fixture picks up the DUT from the second surface of the DUT. Thus, a hard material (e.g. a metal material) of the testing fixture may contact the antenna on the second surface. Thus, the efficiency of the antenna may be negatively influenced (e.g. via deformation of the antenna).

If the DUT includes a plurality of antennas, the antennas of the DUT may emit signals from different directions. However, a test antenna that is used to receive the signals from the antennas of the DUT may be at a fixed location. Thus, during the testing process, the testing fixture with the DUT may be rotated by 360 degrees so that all of the signals from the DUT can be received by the test antenna. It can be difficult to design such a testing fixture. In addition, if the DUT is a radio frequency (RF) AiP with a frequency of 25 GHz to 80 GHz, an up/down converters is included to lower the frequency of a high frequency signal from an antenna to the frequency that can be tested by a tester. The amount of the up/down converters is equal to the amount of the antennas. Thus, if the DUT includes a plurality of antennas, the same amounts of the up/down converters are included. As a result, the cost of testing is increased.

The present disclosure provides for a testing device which be used in a production line during mass production. In some embodiments, the testing device includes a first transmission medium and a second transmission medium disposed in a radiation space of a testing socket. At least some embodiments of the present disclosure provide for a testing method that provides a suction force on a first surface of the DUT so that the electrical contacts on the first surface of the DUT are electrically connected to a test board.

Figure 2:
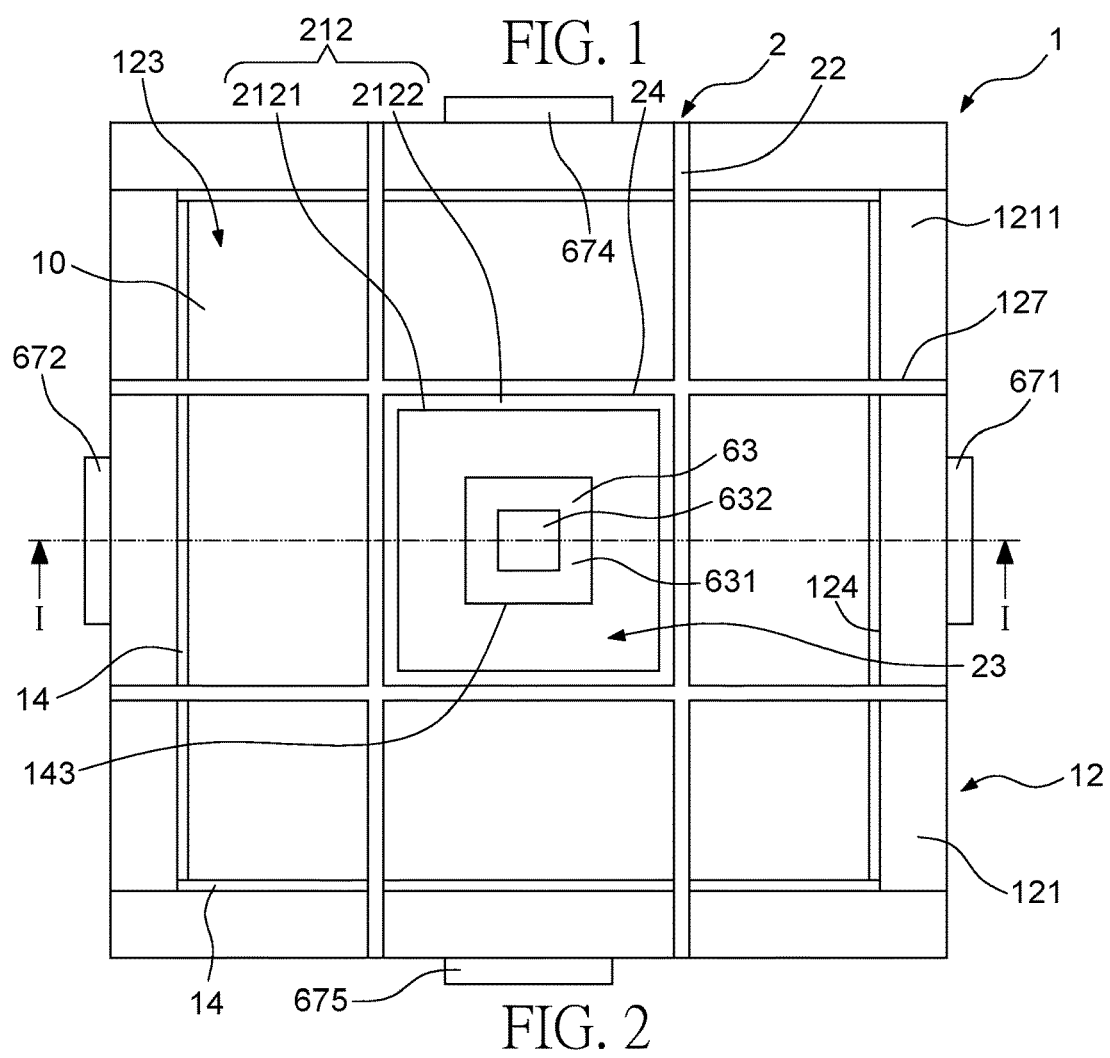
FIG. 2 illustrates a top view of the testing device shown in FIG. 1.

FIG. 1 illustrates a cross-sectional view of a testing device 1 according to some embodiments of the present disclosure. FIG. 2 illustrates a top view of the testing device 1 shown in FIG. 1. It is noted that FIG. 1 is a cross-sectional view taken along line I-I of FIG. 2. The testing device 1 includes a testing socket 12, a first transmission medium (including, for example, a device holder 2), a second transmission medium (including, for example, air 10), an absorber 14, a plurality of measurement modules (including, for example, a first measurement module 61, a second measurement module 62 and a third measurement module 63).

The testing socket 12 defines a radiation space 123, a top opening 125 and a plurality of accommodating openings (including, for example, a first accommodating opening 1261, a second accommodating opening 1262 and a third accommodating opening 1263). The radiation space 123 is disposed between the top opening 125 and the accommodating openings (including, for example, a first accommodating opening 1261, a second accommodating opening 1262 and a third accommodating opening 1263). The radiation space 123, the top opening 125 and the accommodating openings (including, for example, a first accommodating opening 1261, a second accommodating opening 1262 and a third accommodating opening 1263) are in communication with each other. In some embodiments, the testing socket 12 includes one or more side walls 121 (e.g. four side walls 121) and a bottom wall 122. The respective top portions of the side walls 121 may define the top opening 125. The side walls 121 may connect to the bottom wall 122 to define the radiation space 123. Each of the side walls 121 may define an accommodating opening (including, for example, the first accommodating opening 1261, and the second accommodating opening 1262). The bottom wall 122 may define an accommodating opening (including, for example, the third accommodating opening 1263). Each of the side walls 121

(e.g. four side walls 121) and the bottom wall 122 has an inner surface 124. Thus, the inner surfaces 124 of the side walls 121 (e.g. four side walls 121) and the bottom wall 122 define the radiation space 123.

As shown in FIG. 1, the first accommodating opening 1261 and the second accommodating opening 1262 may be located at a top portion of the side walls 121 and may extend through the side walls 121. The third accommodating opening 1263 may be located at a center of the bottom wall 122 and may extend through the bottom wall 122. A width of the top opening 125 is greater than a width of the third accommodating opening 1263 (e.g. by a factor of about 2 or more, about 4 or more, or about 6 or more). In some embodiments, the side walls 121 and the bottom wall 122 are separate walls that are assembled together by, for example, screw. In some embodiments, the side walls 121 and the bottom wall 122 may be formed integrally as a monolithic structure. In addition, the testing socket 12 may further define a plurality of slots 127 in a top (e.g., an upper surface 1211) of the side walls 121 for receiving an extending portion 22 of the device holder 2.

The absorber 14 is disposed on the inner surfaces 124 of the side walls 121 (e.g. four side walls 121) and the bottom wall 122 of the testing socket 12 to define the radiation space 123. As shown in FIG. 1, the absorber 14 defines a plurality of openings corresponding to the accommodating openings of the testing socket 12. For example, the absorber 14 defines a first opening 141, a second opening 142 and a third opening 143. The position of the first opening 141 corresponds to the first accommodating opening 1261, and the size (or width) of the first opening 141 is substantially equal to the size (or width) of the first accommodating opening 1261. The position of the second opening 142 corresponds to the second accommodating opening 1262, and the size (or width) of the second opening 142 is substantially equal to the size (or width) of the second accommodating opening 1262. The position of the third opening 143 corresponds to the third accommodating opening 1263, and the size (or width) of the third opening 143 is substantially equal to the size (or width) of the third accommodating opening 1263.

The absorber 14 may be an electromagnetic wave absorbing material (such as polymer with metal particles dispersed therein), and may be formed in a plate shape. The absorber 14 is attached on the inner surfaces 124 of the testing socket 12 by, for example, adhesion. Thus, the inner surface 124 of the testing socket 12 (with the absorber 14) is a wave absorbing surface. In one embodiment, the absorber 14 may be formed on the inner surface 124 of the testing socket 12 by, for example, coating. The absorber 14 may absorb the electromagnetic wave having a frequency of 25 GHz to 80 GHz.

Figure 9:
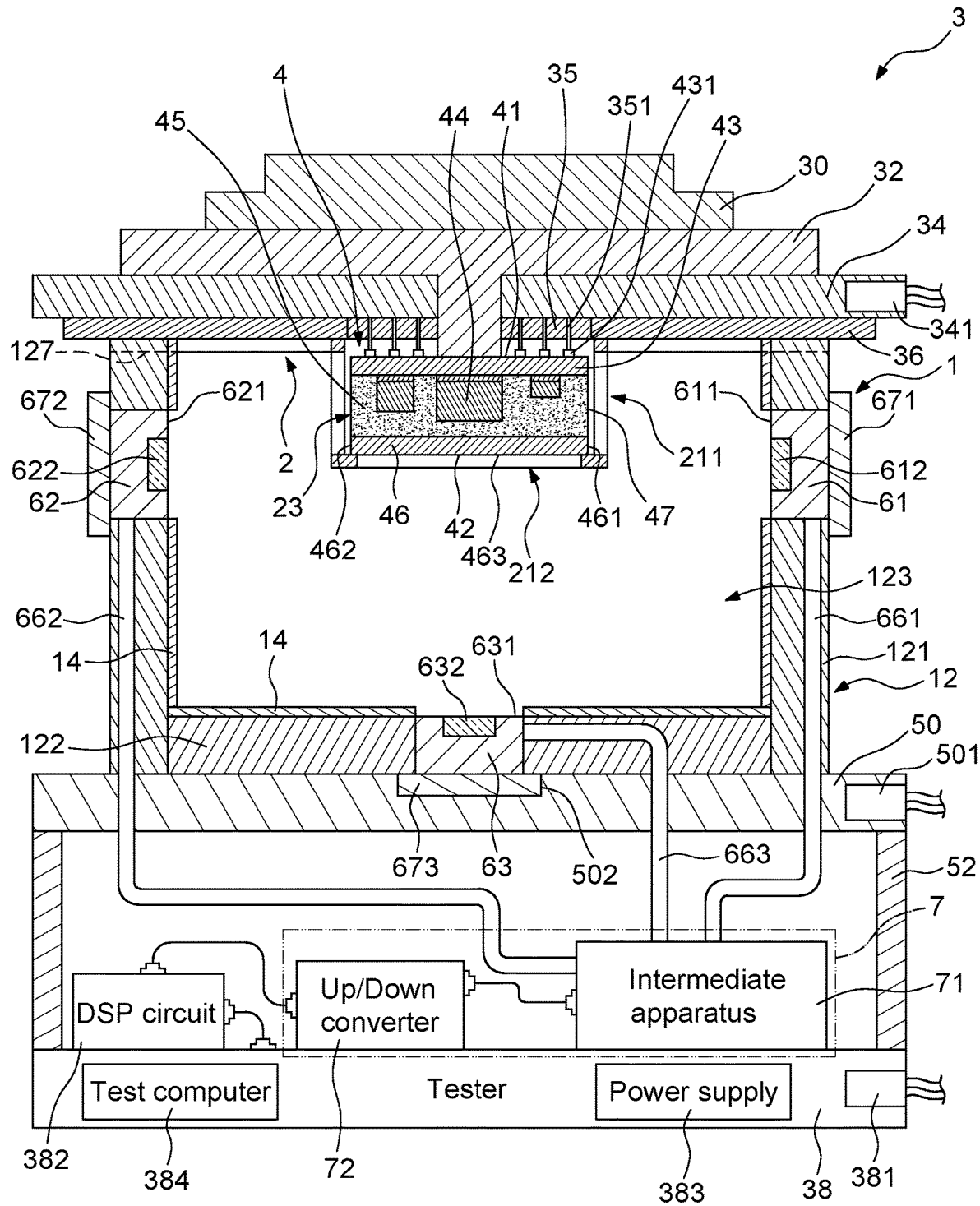
FIG. 9 illustrates a cross-sectional view of a testing system according to some embodiments of the present disclosure.

The first transmission medium (including, for example, a device holder 2) and the second transmission medium (including, for example, air 10) are disposed in the radiation space 123 of the testing socket 12. The first transmission medium (including, for example, a device holder 2) is used for supporting a device under test (DUT) 4 (FIG. 9). In one embodiment, the first transmission medium may be a device holder 2, and the second transmission medium may be air 10. Thus, a dielectric constant (Dk) of the first transmission medium (e.g., device holder 2) is different from a dielectric constant (Dk) of the second transmission medium (e.g., air 10). For example, the dielectric constant (Dk) of the first transmission medium (e.g., device holder 2) may be about 1.0 Farad/meter (F/m) to about 6.0 F/m, and a material of the device holder 2 may be, for example, a plastic, wood, an acrylic or an aerogel. The dielectric constant (Dk) of the second transmission medium (e.g., air 10) may be about 1.0. In some embodiments, the dielectric constant (Dk) of the first transmission medium (e.g., device holder 2) may be very close to the dielectric constant (Dk) of the second transmission medium (e.g., air 10). Alternatively, the dielectric constant (Dk) of the first transmission medium (e.g., device holder 2) may be substantially equal to the dielectric constant (Dk) of the second transmission medium (e.g., air 10).

The device holder 2 is disposed in the radiation space 123, and is supported by the testing socket 12. As shown in FIG. 1, the device holder 2 includes a receiving portion 21 and an extending portion 22. The receiving portion 21 defines an accommodating space 23 for receiving the DUT 4 (see FIG. 9). The extending portion 22 extends from the receiving portion 21 to the upper surface 1211 of the testing socket 12. In some embodiments, the extending portion 22 may be positioned in, or couple with, the slot 127 of the side wall 121 of the testing socket 12. As shown in FIG. 1 and FIG. 2, the device holder 2 is disposed in the radiation space 123, so that the accommodating space 23 is surrounded by the absorber 14, and the measurement modules (including, for example, a first measurement module 61, a second measurement module 62 and a third measurement module 63) face the accommodating space 23 of the device holder 2.

In addition, the receiving portion 21 of the device holder 2 defines an upper opening 24. The upper opening 24 of the device holder 2 corresponds to the first opening 125 of the testing socket 12. In addition, the receiving portion 21 of the device holder 2 includes at least one or more first signal transmission portions 211 and a second signal transmission portion 212. The first signal transmission portions 211 connect to the second signal transmission portion 212, and the first signal transmission portions 211 and the second signal transmission portion 212 together define the accommodating space 23. The second signal transmission portion 212 is opposite to the upper opening 24. As shown in FIG. 1 and FIG. 2, the receiving portion 21 of the device holder 2 includes four first signal transmission portions 211 corresponding to the four lateral sides of the receiving portion 21 respectively. The second signal transmission portion 212 corresponds to the bottom side of the receiving portion 21. In addition, the extending portion 22 extends from the first signal transmission portion 211 to the upper surface 1211 of the testing socket 12. In one embodiment, the device holder 2 may be formed by injection molding.

The measurement modules (including, for example, the first measurement module 61, the second measurement module 62 and the third measurement module 63) are disposed in a respective one of the accommodating openings of the side walls 121 and the bottom wall 122. For example, the first measurement module 61 is disposed in the first accommodating opening 1261, the second measurement module 62 is disposed in the second accommodating opening 1262, and the third measurement module 63 is disposed in the third accommodating opening 1263. That is, the measurement modules (including, for example, the first measurement module 61, the second measurement module 62 and the third measurement module 63) are attached to the testing socket 12. In addition, each of the measurement modules (including, for example, the first measurement module 61, the second measurement module 62 and the third measurement module 63) may include an emitter/receiver that is exposed from the opening of the absorber 14 (e.g., the first opening 141, the second opening 142 or the third opening 143) and faces the receiving portion 21 of the device holder 2. In one embodiment, the measurement modules (including, for example, the first measurement module 61, the second measurement module 62 and the third measurement module 63) are radio units or antenna types. The emitters/receivers of the measurement modules (including, for example, the first measurement module 61, the second measurement module 62 and the third measurement module 63) are antennas. As shown in FIG. 1, the first measurement module 61 has an inner surface 611 and includes a first antenna 612 disposed adjacent to the inner surface 611. The inner surface 611 of the first measurement module 61 may be substantially coplanar with the inner surface 124 of the side wall 121. The first antenna 612 of the first measurement module 61 may be exposed from the first opening 141 of the absorber 14. Similarly, the second measurement module 62 has an inner surface 621 and includes a second antenna 622 disposed adjacent to the inner surface 621. The inner surface 621 of the second measurement module 62 may be substantially coplanar with the inner surface 124 of the side wall 121. The second antenna 622 of the second measurement module 62 may be exposed from the second opening 142 of the absorber 14. Similarly, the third measurement module 63 has an inner surface 631 and includes a third antenna 632 disposed adjacent to the inner surface 631. The inner surface 631 of the third measurement module 63 may be substantially coplanar with the inner surface 124 of the bottom wall 122. The third antenna 632 of the third measurement module 63 may be exposed from the third opening 143 of the absorber 14.

As shown in FIG. 1, the testing device 1 may further includes a first connector 661, a second connector 662, a third connector 663, a first fixing cover 671, a second fixing cover 672 and a third fixing cover 673. The first connector 661 is electrically connected to the first measurement module 61. The second connector 662 is electrically connected to the second measurement module 62. The third connector 663 is electrically connected to the third measurement module 63. For example, the first connector 661, the second connector 662 and the third connector 663 may be coaxial cable, flexible printed circuit (FPC) or conductive via in the side wall 121 and the bottom wall 122. In addition, a size of the first fixing cover 671 is greater than a size of the first accommodating opening 1261, so that the first fixing cover 671 is attached to the outer surface of the side wall 121 to cover and fix the first measurement module 61. A size of the second fixing cover 672 is greater than a size of the second accommodating opening 1262, so that the second fixing cover 672 is attached to the outer surface of the side wall 121 to cover and fix the second measurement module 62. A size of the third fixing cover 673 is greater than a size of the third accommodating opening 1263, so that the third fixing cover 673 is attached to the outer surface of the bottom wall 122 to cover and fix the third measurement module 63.

Figure 3:
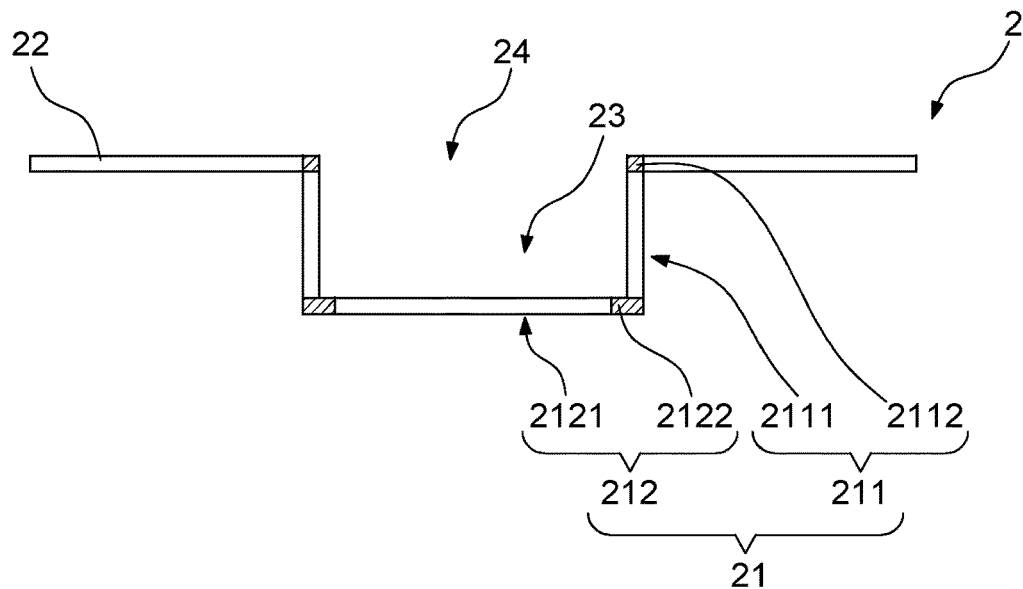
FIG. 3 illustrates a cross-sectional view of the device holder of the testing device of FIG. 1.
Figure 4:
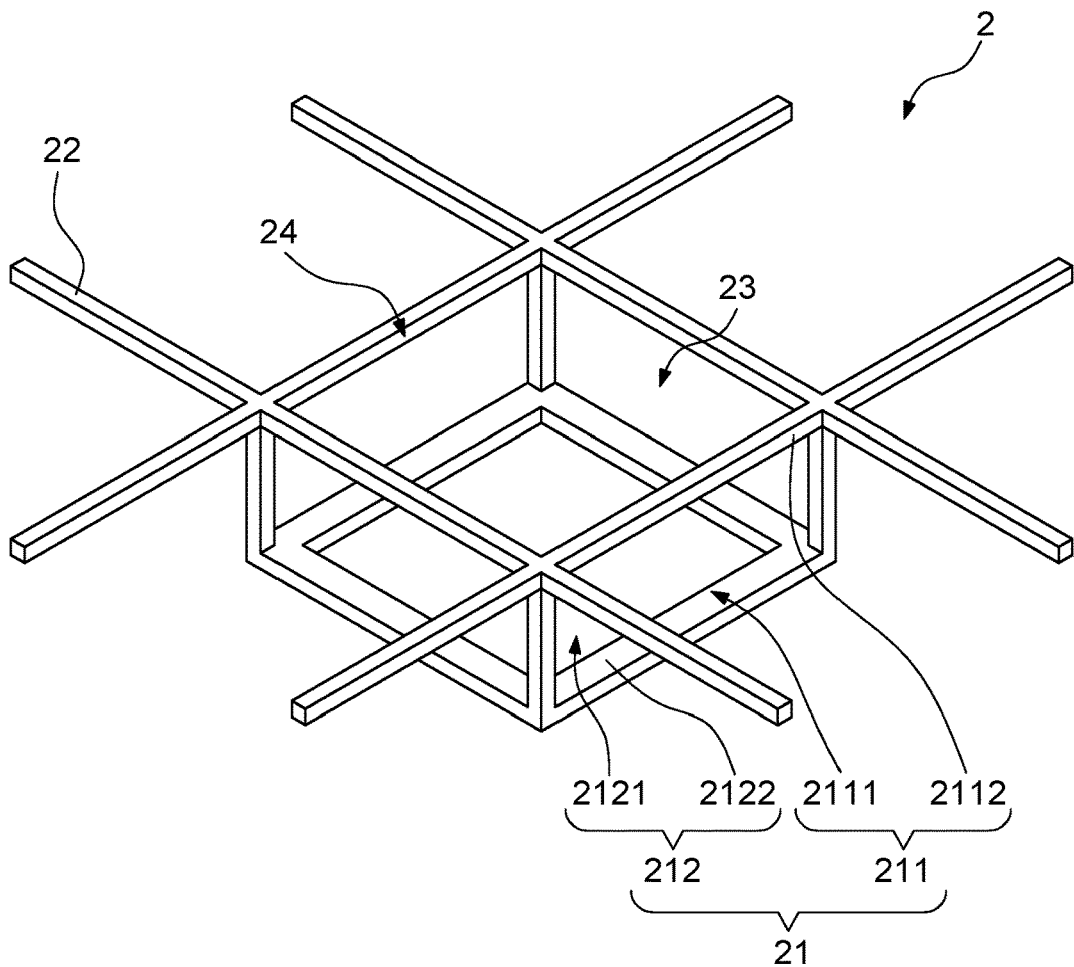
FIG. 4 illustrates a perspective view of the device holder shown in FIG. 3.

FIG. 3 illustrates a cross-sectional view of the device holder 2 of the testing device 1 of FIG. 1. FIG. 4 illustrates a perspective view of the device holder 2 shown in FIG. 3. The device holder 2 may include a plurality of strips or bars and may be formed integrally as a monolithic structure. In some embodiments, a material of the device holder 2 may be, for example, a plastic, wood, an acrylic or an aerogel. The first signal transmission portion 211 of the receiving portion 21 defines a lateral opening 2111, and includes the lateral opening 2111 and a first strip portion 2112. The second signal transmission portion 212 of the receiving portion 21 defines a lower opening 2121, and includes the lower opening 2121 and a second strip portion 2122. The second strip portion 2122 can hold the bottom edge of the DUT 4 (see FIG. 9). Thus, the accommodating space 23 of the device holder 2 is communicated with the radiation space 123 of the testing socket 12 (see FIG. 1) through the lower opening 2121 and the lateral opening 2111. The device holder 2 of FIG. 3 and FIG. 4 can be referred to as a "net bag type".

Figure 5:
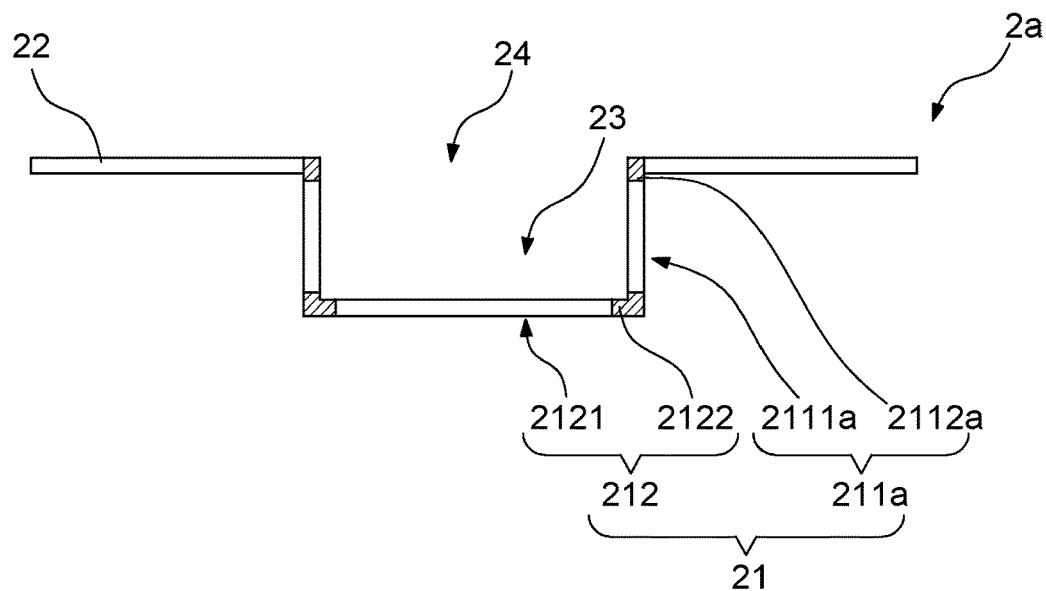
FIG. 5 illustrates a cross-sectional view of a device holder according to some embodiments of the present disclosure.
Figure 6:
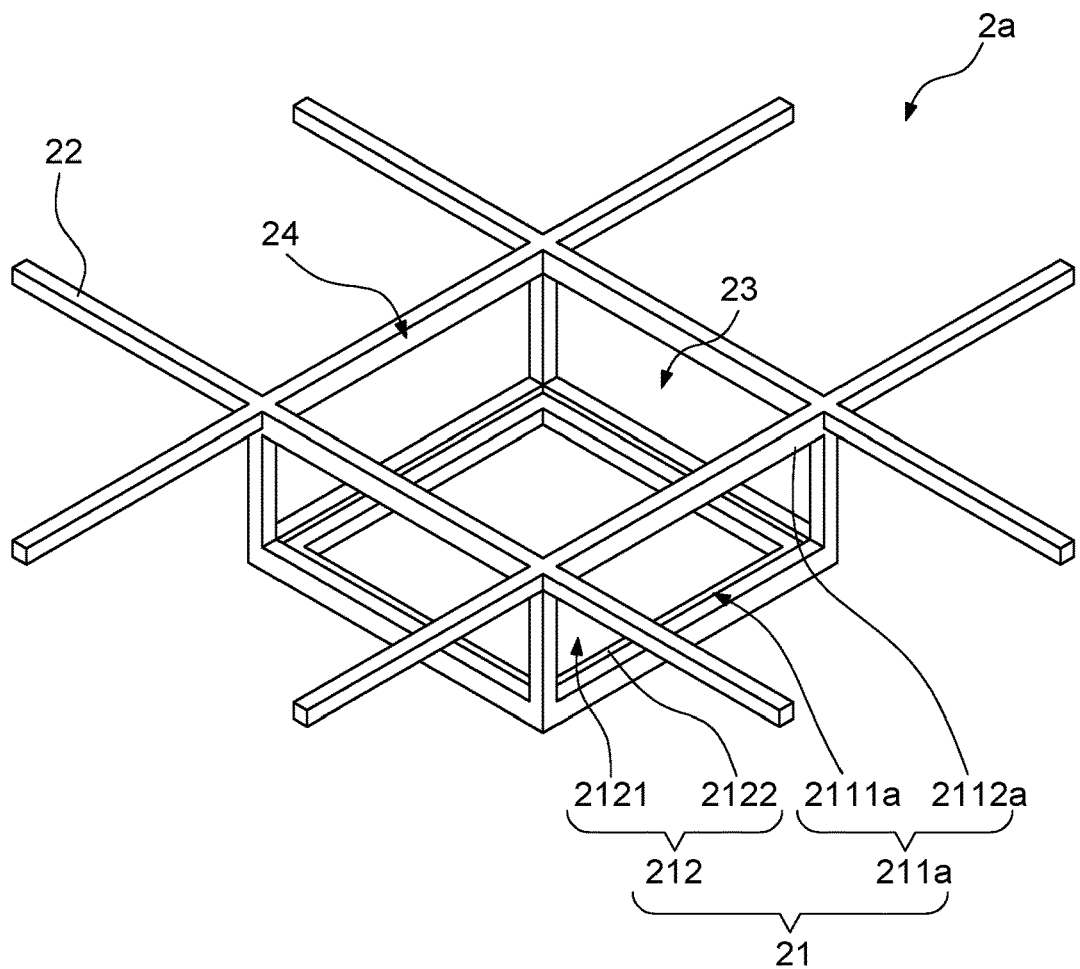
FIG. 6 illustrates a perspective view of the device holder shown in FIG. 5.

FIG. 5 illustrates a cross-sectional view of a device holder 2a according to some embodiments of the present disclosure. FIG. 6 illustrates a perspective view of the device holder 2a shown in FIG. 5. The device holder 2a is similar to the device holder 2 shown in FIG. 3 and FIG. 4, but differs as follows. As shown in FIG. 5 and FIG. 6, the first signal transmission portions 211 may include a first signal transmission portion 211a, and a first strip portion 2112a of the first signal transmission portion 211a extends toward a lateral opening 2111a. Thus, a size of the lateral opening 2111a of the first signal transmission portion 211a of FIG. 5 and FIG. 6 is smaller than a size of the lateral opening 2111 of the first signal transmission portion 211 of FIG. 3 and FIG. 4. The extended first strip portion 2112a can hold the lateral side surface 47 of the DUT 4.

Figure 7:
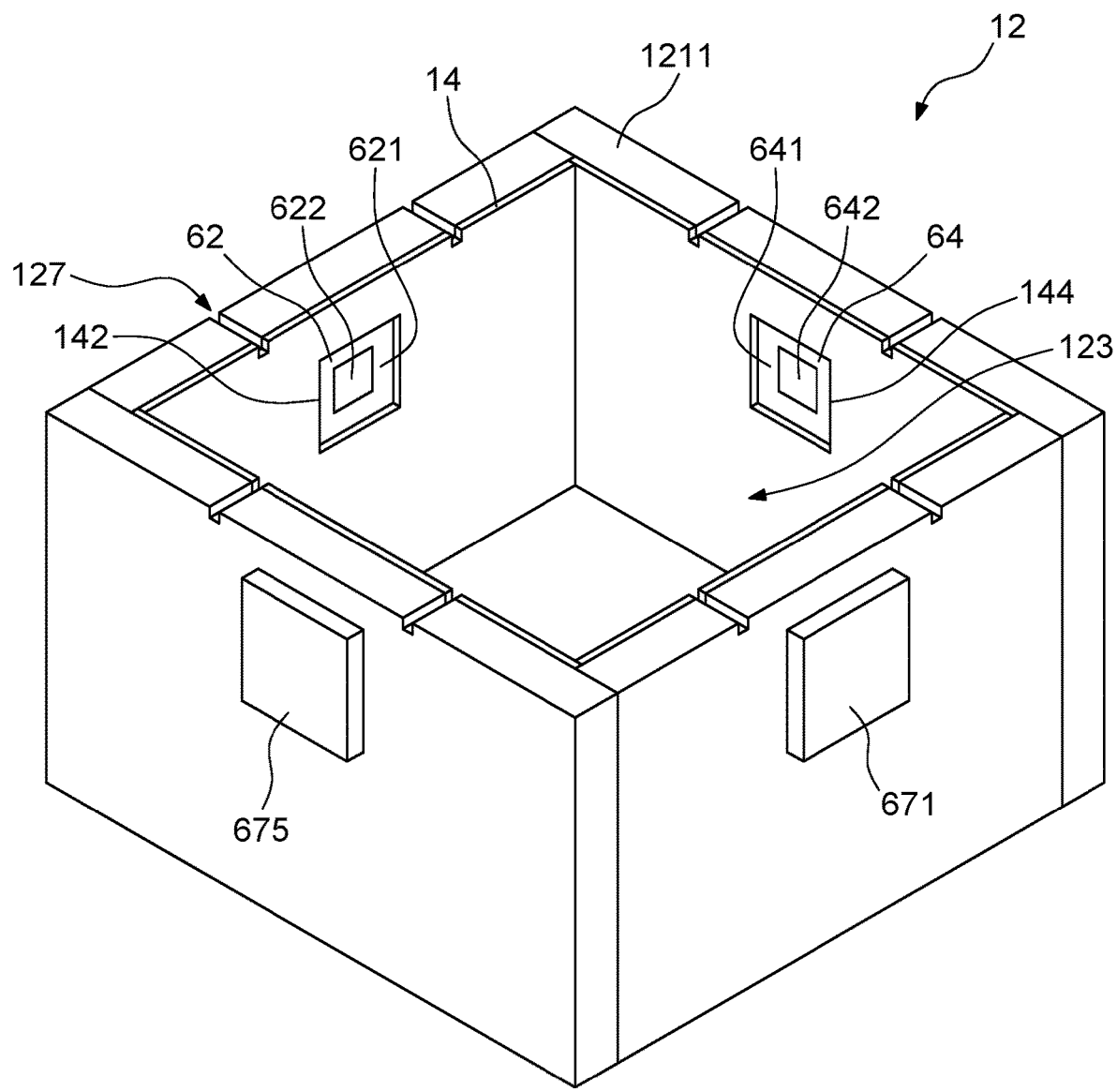
FIG. 7 illustrates a perspective view of the testing socket of the testing device of FIG. 1, wherein the first connector, the second connector and the third connector are omitted.
Figure 8:
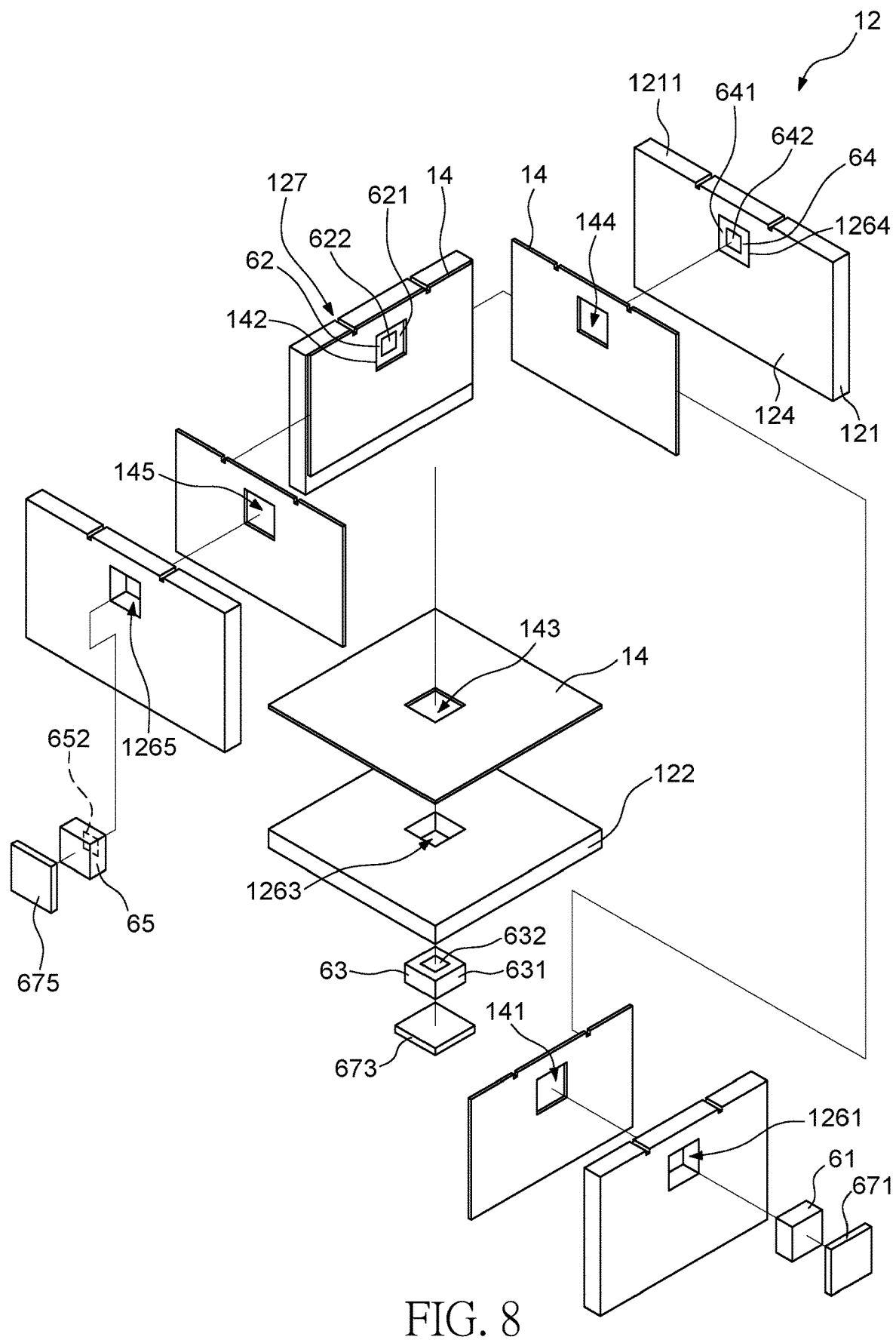
FIG. 8 illustrates an exploded view of the testing socket of FIG. 7.

FIG. 7 illustrates a perspective view of the testing socket 12 of the testing device 1 of FIG. 1, wherein the first connector 661, the second connector 662 and the third connector 663 are omitted. FIG. 8 illustrates an exploded view of the testing socket 12 of FIG. 7. The testing socket 12 may include four side walls 121 and a bottom wall 122. The top portions of the side walls 121 may define the top opening 125. The side walls 121 may connect to the bottom wall 122 to define the radiation space 123. Each of the side walls 121 and the bottom wall 122 has an inner surface 124, and defines an accommodating opening (including, for example, a first accommodating opening 1261, a second accommodating opening 1262, a third accommodating opening 1263, a fourth accommodating opening 1264 and a fifth accommodating opening 1265). The radiation space 123, the top opening 125 and the accommodating openings (including, the first accommodating opening 1261, the second accommodating opening 1262, the third accommodating opening 1263, the accommodating opening 1264 and the fifth accommodating opening 1265) are in communication with each other. Thus, the inner surfaces 124 of the side walls 121 and the bottom wall 122 define the radiation space 123. In some embodiments, the side walls 121 and the bottom wall 122 are separate walls that are assembled together by, for example, screw. In some embodiments, the side walls 121 and the bottom wall 122 may be formed integrally as a monolithic structure. In addition, the testing socket 12 may further define a plurality of slots 127 in a top (e.g., an upper surface 1211) of the side walls 121 for receiving an extending portion 22 of the device holder 2.

The absorber 14 is disposed on the inner surfaces 124 of the side walls 121 and the bottom wall 122 of the testing socket 12 to define the radiation space 123 by, for example, adhesion. The absorber 14 defines a plurality of openings corresponding to the accommodating openings of the testing socket 12. For example, the absorber 14 defines a first opening 141, a second opening 142, a third opening 143, a fourth opening 144 and a fifth opening 145. The positions of the first opening 141, the second opening 142, the third opening 143, the fourth opening 144 and the fifth opening 145 correspond to the first accommodating opening 1261, the second accommodating opening 1262, the third accommodating opening 1263, the fourth accommodating opening 1264 and the fifth accommodating opening 1265, respectively. The sizes (or widths) of the first opening 141, the second opening 142, the third opening 143, the fourth opening 144 and the fifth opening 145 are substantially equal to the size (or width) of the first accommodating opening 1261, the second accommodating opening 1262, the third accommodating opening 1263, the fourth accommodating opening 1264 and the fifth accommodating opening 1265, respectively.

The measurement modules (including, for example, the first measurement module 61, the second measurement module 62, the third measurement module 63, a fourth measurement module 64 and a fifth measurement module 65) are disposed in a respective one of the accommodating openings (including, for example, the first accommodating opening 1261, the second accommodating opening 1262, the third accommodating opening 1263, the accommodating opening 1264 and the fifth accommodating opening 1265) of the side walls 121 and the bottom wall 122. In addition, each of the measurement modules (including, for example, the first measurement module 61, the second measurement module 62, the third measurement module 63, the fourth measurement module 64 and the fifth measurement module 65) may include an emitter/receiver (e.g., antenna) that is exposed from the opening of the absorber 14 (e.g., the first opening 141, the second opening 142, the third opening 143, the fourth opening 144 and the fifth opening 145) and faces the receiving portion 21 of the device holder 2.

As shown in FIG. 1 and FIG. 8, the testing device 1 may further includes the first fixing cover 671, a second fixing cover 672, a third fixing cover 673, a fourth fixing cover 674 and a fifth fixing cover 675. The first fixing cover 671, the second fixing cover 672, the third fixing cover 673, the fourth fixing cover 674 and the fifth fixing cover 675 are attached to the outer surfaces of the side walls 121 and the bottom wall 122 to cover and fix the first measurement module 61, the second measurement module 62, the third measurement module 63, the fourth measurement module 64 and the fifth measurement module 65, respectively.

Figure 10:
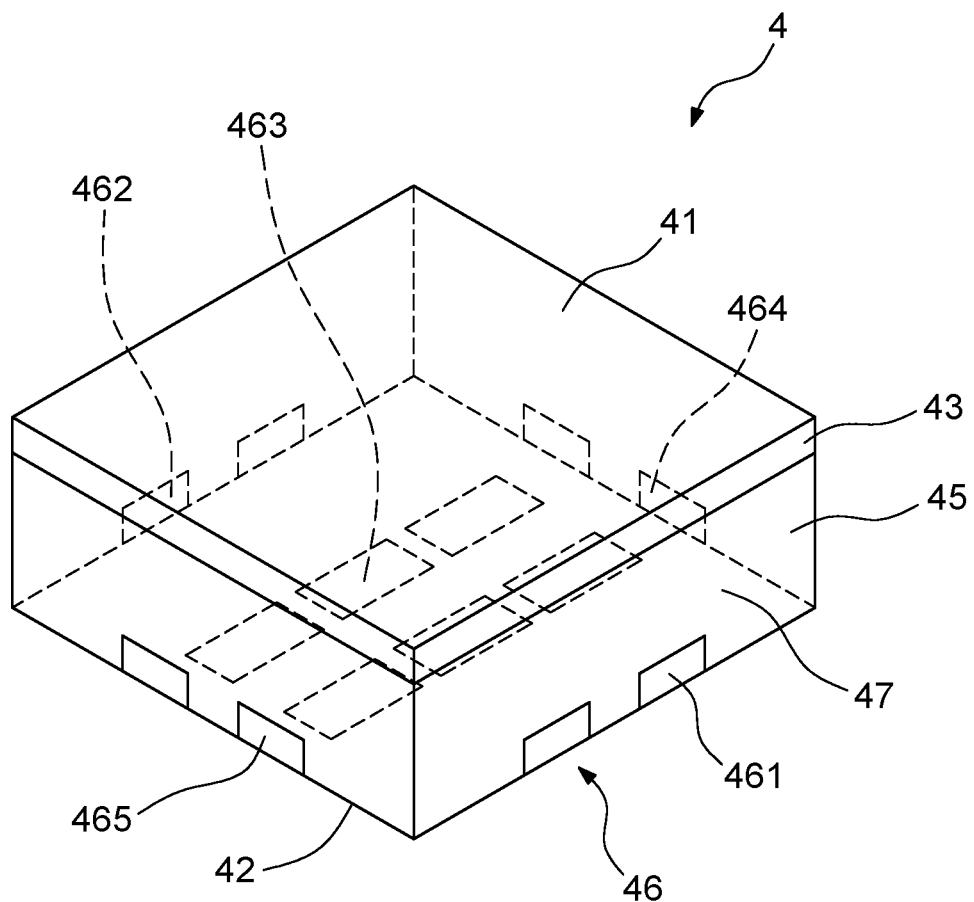
FIG. 10 illustrates a perspective view of a DUT according to some embodiments of the present disclosure.

FIG. 9 illustrates a cross-sectional view of a testing system 3 according to some embodiments of the present disclosure. FIG. 10 illustrates a perspective view of a DUT 4 according to some embodiments of the present disclosure. The testing system 3 includes a testing device 1, a DUT 4, a top circuit board 34 (e.g., a test board), a handler arm 30, a chuck 32, a connecting socket 35, a top absorber 36, a tester 38, a bottom circuit board 50 (e.g., a load board), a board stiffener 52, a digital signal processor (DSP) circuit 382 and a sub-system 7. The testing device 1 of FIG. 9 is the same as the testing device 1 of FIG. 1 and FIG. 2, and includes the testing socket 12 and the device holder 2.

The DUT 4 is disposed in the accommodating space 23 of the device holder 2, and the DUT 4 includes at least one radiation source (e.g., signal emission source) corresponding to at least one of the first signal transmission portion 211 and the second signal transmission portion 212. The radiation source (e.g., signal emission source) may have the function of emitting/receiving signals. In some embodiments, the DUT 4 may be a package structure, and may have a first surface 41, a second surface 42 opposite to the first surface 41, and a plurality of lateral side surface 47. The DUT 4 may include a substrate 43, at least one electrical element 44, an encapsulant 45 and an antenna 46. Thus, the DUT 4 is an antenna in package (AiP). For example, the DUT 4 may be a wireless module such as a mmWave wireless module. In one embodiment, the DUT 4 may be a radio frequency (RF) AiP with a frequency of 25 GHz to 80 GHz or 30 GHz to 80 GHz.

The substrate 43 is disposed adjacent to the first surface 41, and includes a plurality of electrical contacts 431 (e.g., solder balls or solder bumps) disposed adjacent to the upper surface thereof (e.g., the first surface 41). The electrical element 44, such as a semiconductor die and/or a passive element, is electrically connected to the lower surface of the substrate 43. The encapsulant 45, such as a molding compound, covers the lower surface of the substrate 43 and the electrical element 44. The antenna 46 is embedded in or disposed on the encapsulant 45. That is, the antenna 46 is disposed adjacent to the second surface 42 of the DUT 4. The antenna 46 is a radiation source (e.g., signal emission source). The bottom portion of the antenna 46 may be exposed from the second surface 42 of the DUT 4, and a portion of the side portion of the antenna 46 may be exposed from the lateral side surface 47 of the DUT 4. Thus, the lateral side surface 47 of the DUT 4 may be a radiation source (e.g., signal emission source) corresponding to the first signal transmission portion 211 of the device holder 2 and the first measurement module 61 and the second measurement module 62. The second surface 42 of the DUT 4 may be a radiation source (e.g., signal emission source) corresponding to the second signal transmission portion 212 of the device holder 2 and the third measurement module 63. As shown in FIG. 9, the antenna 46 may face downward. The portion of the side portion of the antenna 46 is exposed from the lateral opening 2111 of the first signal transmission portion 211 of the device holder 2, and the portion of the bottom portion of the antenna 46 is exposed from the lower opening 2121 of the second signal transmission portion 212 of the device holder 2.

Referring to FIG. 10, the pattern of the antenna 46 of the DUT 4 may include a first radiation source/receiver 461 (also referred to as "port 1"), a second radiation source/receiver 462 (also referred to as "port 2"), a third radiation source/receiver 463 (also referred to as "port 3"), a fourth radiation source/receiver 464 (also referred to as "port 4") and a fifth radiation source/receiver 465 (also referred to as "port 5"). The first radiation source/receiver 461 (also referred to as "port 1"), the second radiation source/receiver 462 (also referred to as "port 2"), the fourth radiation source/receiver 464 (also referred to as "port 4") and the fifth radiation source/receiver 465 (also referred to as "port 5") are disposed adjacent to the lateral side surface 47 of the DUT 4. The third radiation source/receiver 463 (also referred to as "port 3") is disposed adjacent to the second surface 42 of the DUT 4. Referring to FIG. 9, the first antenna 612 of the first measurement module 61 may receive a radio frequency signal from the first radiation source/receiver 461 of the antenna 46 of the DUT 4, or may emit a radio frequency signal to the first radiation source/receiver 461 of the antenna 46 of the DUT 4. The second antenna 622 of the second measurement module 62 may receive a radio frequency signal from the second radiation source/receiver 462 of the antenna 46 of the DUT 4, or may emit a radio frequency signal to the second radiation source/receiver 462 of the antenna 46 of the DUT 4. The third antenna 632 of the third measurement module 63 may receive a radio frequency signal from the third radiation source/receiver 463 of the antenna 46 of the DUT 4, or may emit a radio frequency signal to the third radiation source/receiver 463 of the antenna 46 of the DUT 4. In addition, the fourth antenna 642 of the fourth measurement module 64 (FIG. 7 and FIG. 8) may receive a radio frequency signal from the fourth radiation source/receiver 464 (FIG. 10) of the antenna 46 of the DUT 4, or may emit a radio frequency signal to the fourth radiation source/receiver 464 of the antenna 46 of the DUT 4. The fifth antenna 652 (FIG. 8) of the fifth measurement module 65 may receive a radio frequency signal from the fifth radiation source/receiver 465 of the antenna 46 of the DUT 4, or may emit a radio frequency signal to the fifth radiation source/receiver 465 of the antenna 46 of the DUT 4. That is, the measurement modules (including, for example, the first measurement module 61, the second measurement module 62, the third measurement module 63, the fourth measurement module 64 and the fifth measurement module 65) corresponds to and communicates with a respective one of the radiation source/receivers (including, for example, the first radiation source/receiver 461, the second radiation source/receiver 462, the third radiation source/receiver 463, the fourth radiation source/receiver 464 and the fifth radiation source/receiver 465).

Referring to FIG. 9, the top absorber 36 is disposed on the top portion (e.g., the upper surface 1211) of the testing socket 12 of the testing fixture 11, and on the extending portion 22 of the device holder 2. Alternatively, the top absorber 36 may be attached to the bottom surface of the top circuit board 34. The material of the top absorber 36 may be same as or different from the material of the absorber 14. The top circuit board 34 (e.g., a print circuit board (PCB)) is disposed above the first opening 125 of the testing socket 12, and is electrically connected to the DUT 4. In one embodiment, the top circuit board 34 is attached to the handler arm 30 through a chuck 32. The chuck 32 can be used for applying suction to the DUT 4. In one embodiment, the top circuit board 34 includes a first terminal 341. A portion of the extending portion 22 of the device holder 2 is disposed between the testing socket 12 and the top circuit board 34.

The connecting socket 35 is attached to the lower surface of the top circuit board 34, and includes a plurality of testing probes 351. One end of the testing probe 351 is used to contact the electrical contacts 431 of the DUT 4, and the other end of the testing probe 351 is used to contact the top circuit board 34. When the chuck 32 sucks the first surface 41 of the DUT 4, the DUT 4 can be electrically connected to the top circuit board 34 through the electrical contacts 431 and the testing probes 351.

The tester 38, the DSP circuit 382, the sub-system 7, the bottom circuit board 50 and the board stiffener 52 are disposed under the testing device 1. The board stiffener 52 is disposed on the tester 38 and is used for support the bottom circuit board 50. That is, the bottom circuit board 50 is supported by the tester 38 through the board stiffener 52. The testing device 1 is disposed on the bottom circuit board 50. Thus, the bottom circuit board 50 is disposed between the testing device 1 and the tester 38. The bottom circuit board 50 defines a hole 502 for receiving the third fixing cover 673. However, in one embodiment, the third fixing cover 673 and the hole 502 may be omitted. In addition, the bottom circuit board 50 may include a second terminal 501. In some embodiments, the bottom circuit board 50 may be electrically connected to the top circuit board 34 through the first terminal 341 and the second terminal 501. In some embodiments, the bottom circuit board 50 may be electrically connected to the tester 38.

Figure 13:
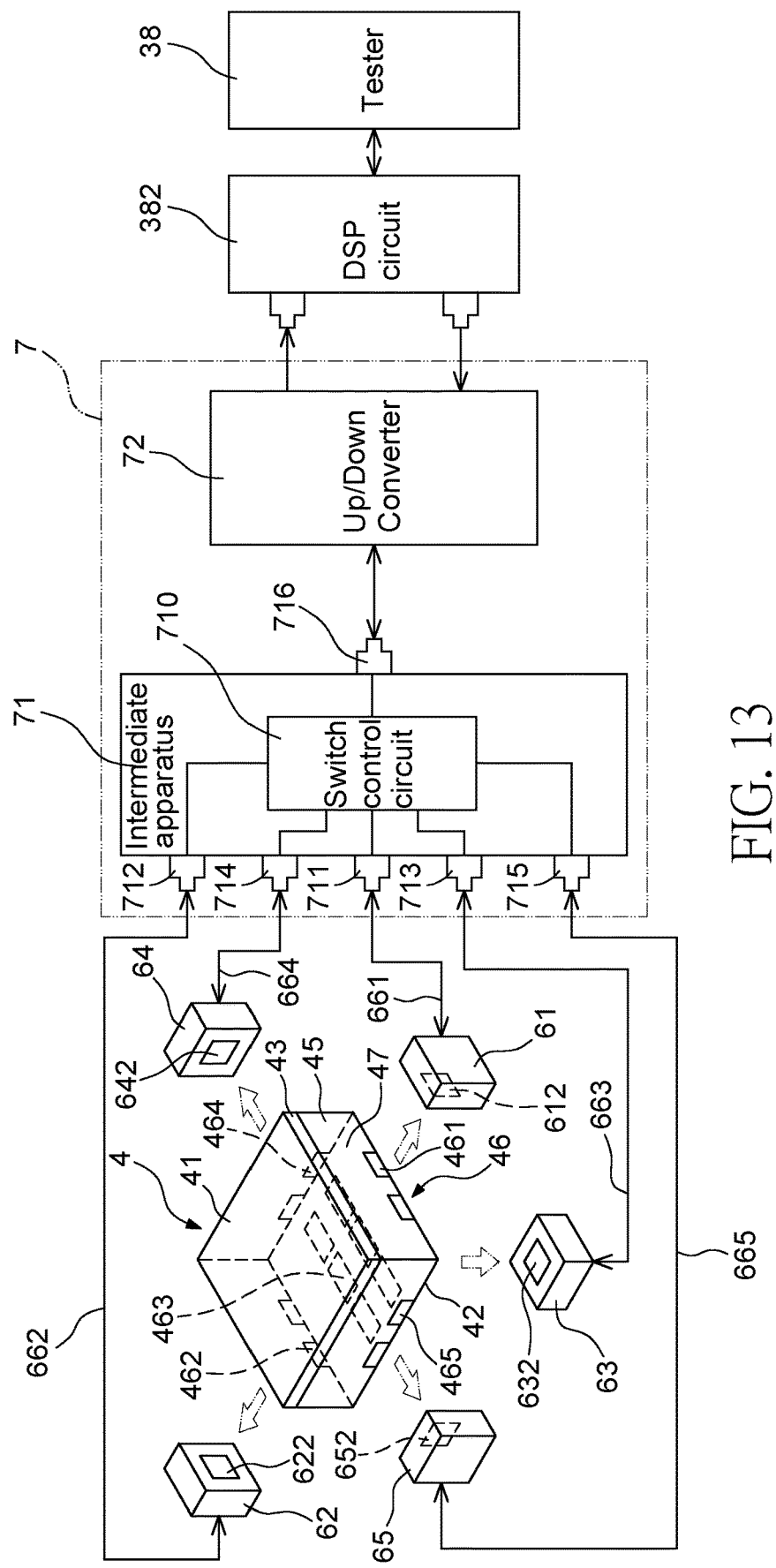
FIG. 13 illustrates a schematic circuit diagram performing a first operation method and a second operation method of the testing system according to some embodiments of the present disclosure.

The tester 38 includes a third terminal 381, a power supply 383 and a test computer 384. The tester 38 may be electrically connected to the top circuit board 34 through the third terminal 381 and the first terminal 341. Furthermore, the tester 38 may be electrically connected to the bottom circuit board 50 through the third terminal 381 and the second terminal 501. The power supply 383 and the test computer 384 are electrically connected to the top circuit board 34 to control the DUT 4. The test computer 384 may include a processor, and may execute instructions written on a machine-readable medium that, when executed by the processor, cause the processor to perform processes described herein, such as analysis of an electromagnetic signal. The sub-system 7 may be electrically connected to the tester 38 through the DSP circuit 382. The sub-system 7 includes an intermediate apparatus 71 and an up/down converter 72. The up/down converter 72 is electrically connected to the intermediate apparatus 71 and electrically connected to the tester 38 through the DSP circuit 382. The up/down converter 72 is used for lowering or raising a frequency of a signal. The intermediate apparatus 71 is in communication with the DUT 4. In one embodiment, the intermediate apparatus 71 is electrically connected to the first measurement module 61 through the first connector 661, is electrically connected to the second measurement module 62 through the second connector 662, and is electrically connected to the third measurement module 63 through the third connector 663. In addition, the intermediate apparatus 71 is electrically connected to the fourth measurement module 64 through a fourth connector 664 (FIG. 13), and is electrically connected to the fifth measurement module 65 through a fifth connector 665 (FIG. 13).

In the embodiment illustrated in FIG. 9, the testing system 3 can test the emitting function and/or the receiving function of the DUT 4. For example, under a first testing mode, the emitting function of the DUT 4 is tested. The tester 38 controls the DUT 4 to emit high frequency waves (e.g., mmWaves having a wavelength on the order of millimeters). The high frequency wave emitted from the DUT 4 may pass through the first signal transmission portion 211 and/or the second signal transmission portion 212 of the device holder 2, and then received by the measurement modules (including, for example, the first measurement module 61, the second measurement module 62, the third measurement module 63, the fourth measurement module 64 and the fifth measurement module 65). Then, the signals from the measurement modules (including, for example, the first measurement module 61, the second measurement module 62, the third measurement module 63, the fourth measurement module 64 and the fifth measurement module 65) may be lowered to an intermediate frequency by the up/down converter 72. Finally, the tester 38 can determine whether a desired emitting function of the DUT 4 is achieved according to an analysis of the signals from the DSP circuit 382 and the up/down converter 72. In addition, under a second testing mode, the receiving function of the DUT 4 is tested. The tester 38 processes intermediate frequency signals to high frequency signals by the up/down converter 72. Then, the tester 38 controls the measurement modules (including, for example, the first measurement module 61, the second measurement module 62, the third measurement module 63, the fourth measurement module 64 and the fifth measurement module 65) to emit high frequency waves (e.g., mmWaves). The high frequency wave emitted from the measurement modules (including, for example, the first measurement module 61, the second measurement module 62, the third measurement module 63, the fourth measurement module 64 and the fifth measurement module 65) may pass through the first signal transmission portion 211 and/or the second signal transmission portion 212 of the device holder 2, and then be received by the DUT 4. Finally, the tester 38 can determine whether a desired receiving function of the DUT 4 is achieved according to an analysis of the signals from the DUT 4.

Therefore, the wave may be transmitted in the air (e.g. solely in the air). Thus, the material of the device holder 2 may not substantially influence the testing result so that the material of the device holder 2 may not be a significant environmental variable of the testing process. In addition, all of the waves transmitted in the radiation space 123 can be received by the measurement modules (including, for example, the first measurement module 61, the second measurement module 62, the third measurement module 63, the fourth measurement module 64 and the fifth measurement module 65) or the DUT 4 due the design of the absorber 14 and the top absorber 36. Thus, a size of the testing device 1 can be reduced to X*X*X dimensions, where X is, for example, about 30 cm or less, about 10 cm or less, or about 5 cm or less. The dimensions of the testing device 1 need not be equal to each other. In addition, such a testing method may be performed in less time than comparative testing methods. Therefore, such testing device 1 can be used in a production line during mass production. Further, during the testing process, the DUT 4 need not be rotated by 360 degrees, thus, the testing device 1 may be more readily designed and manufactured. In addition, the testing process of the multiple radiation source/receivers of the antenna 46 of the DUT 4 may be performed by a single one up/down converter 72, thus, the testing cost is reduced.

Figure 11:
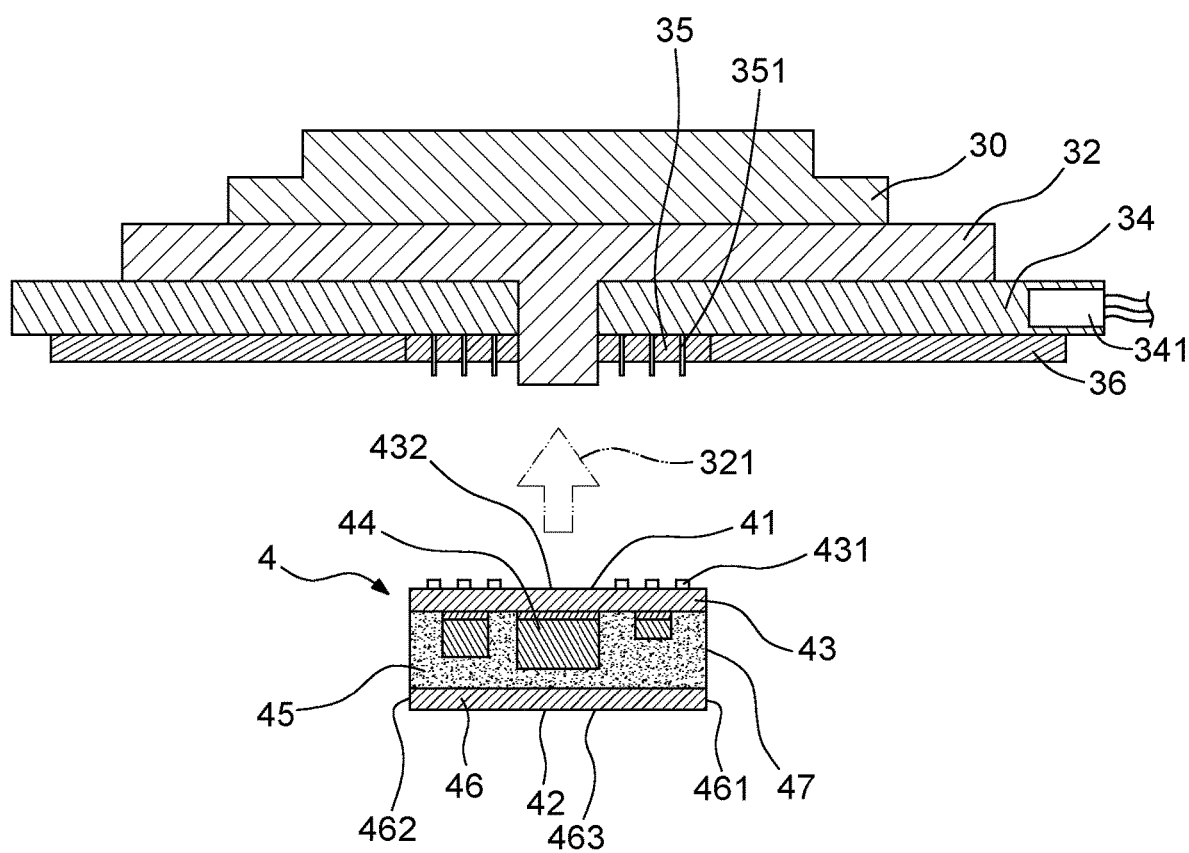
FIG. 11 illustrates one or more stages of an example of a testing method according to some embodiments of the present disclosure.

FIG. 11 through FIG. 15 illustrate a testing method according to some embodiments of the present disclosure. Referring to FIG. 11, the DUT 4, the top circuit board 34 (e.g., a test board), the handler arm 30, the chuck 32, the connecting socket 35 and the top absorber 36, are provided. In some embodiments, the DUT 4 may be a package structure, and may have a first surface 41, a second surface 42 opposite to the first surface 41, and a plurality of lateral side surfaces 47. The DUT 4 may include a substrate 43, at least one electrical element 44, an encapsulant 45 and an antenna 46. The substrate 43 is disposed adjacent to the first surface 41, and includes a free area 432 and a plurality of electrical contacts 431 (e.g., solder balls or solder bumps) disposed adjacent to the upper surface of the DUT 4 (e.g., the first surface 41). The free area 432 is disposed on the upper surface of the substrate 43 (e.g., the first surface 41 of the DUT 4), and has no electrical contacts. Thus, the free area 432 is an area for the chuck 32 to contact. The electrical element 44, such as a semiconductor die or a passive element, is electrically connected to the lower surface of the substrate 43. The encapsulant 45, such as a molding compound, covers the lower surface of the substrate 43 and the electrical element 44. The antenna 46 is embedded in or disposed on the encapsulant 45. That is, the antenna 46 is disposed adjacent to the second surface 42 of the DUT 4. The bottom portion of the antenna 46 may be exposed from the second surface 42 of the DUT 4, and a portion of the side portion of the antenna 46 may be exposed from the lateral side surfaces 47 of the DUT 4. As shown in FIG. 11, the antenna 46 may face downward. In one embodiment, as shown in FIG. 10, the pattern of the antenna 46 may include the first radiation source/receiver 461 (also referred to as "port 1"), the second radiation source/receiver 462 (also referred to as "port 2"), the third radiation source/receiver 463 (also referred to as "port 3"), the fourth radiation source/receiver 464 (also referred to as "port 4") and the fifth radiation source/receiver 465 (also referred to as "port 5").

The top circuit board 34 is attached to the handler arm 30 through the chuck 32. The chuck 32 is used for applying suction to the DUT 4. The connecting socket 35 is attached to the lower surface of the top circuit board 34, and includes a plurality of testing probes 351. Then, the chuck 32 provides a suction force 321 on the free area 432 of the first surface 41 of the DUT 4. Thus, the chuck 32 sucks the first surface 41 of the DUT 4, and the electrical contacts 431 of the DUT 4 can be electrically connected to the top circuit board 34 through the testing probes 351.

Figure 12:
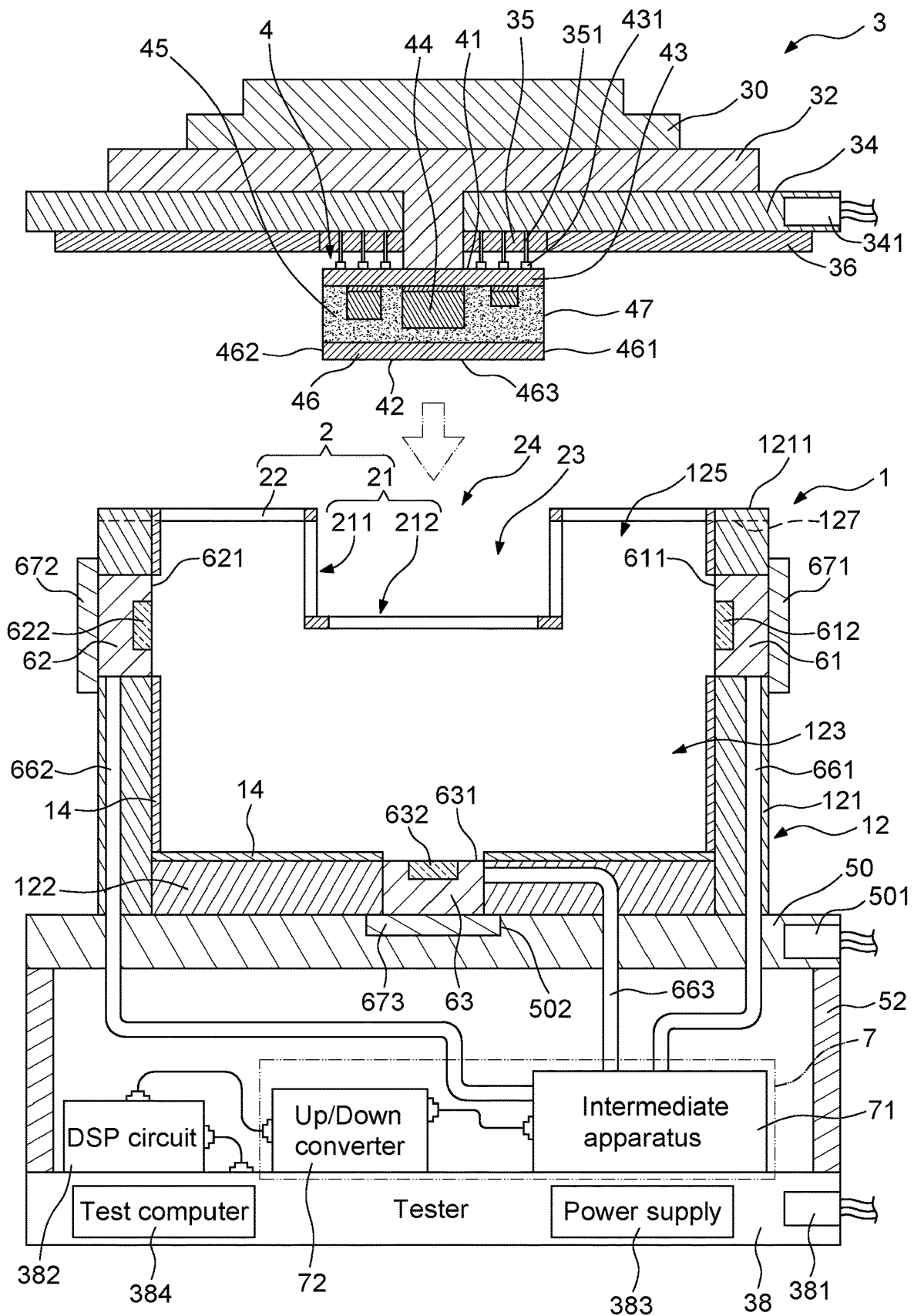
FIG. 12 illustrates one or more stages of an example of a testing method according to some embodiments of the present disclosure.

Referring to FIG. 12, the testing socket 12 and the measurement modules (including, for example, the first measurement module 61, the second measurement module 62, the third measurement module 63, the fourth measurement module 64 and the fifth measurement module 65) are provided (see FIG. 1, FIG. 7 and FIG. 8). Then, the device holder 2 (see FIG. 1 to FIG. 4) are provided to be disposed in the first opening 125 of the testing socket 12 so that the device holder 2 is disposed in the radiation space 123, and is supported by the testing socket 12. In some embodiments, the extending portion 22 may be positioned in, or couple with, the slot 127 of the side wall 121 of the testing socket 12. Meanwhile, the testing device 1 (see FIG. 1) is obtained.

The tester 38, the DSP circuit 382, the sub-system 7, the bottom circuit board 50 and the board stiffener 52 are provided to be disposed below the testing device 1. The board stiffener 52 is disposed on the tester 38 and is used for support the bottom circuit board 50. In some embodiments, the bottom circuit board 50 may be electrically connected to the top circuit board 34 through the first terminal 341 and the second terminal 501. In some embodiments, the bottom circuit board 50 may be electrically connected to the tester 38 through the third terminal 381 and the second terminal 501. The tester 38 includes the power supply 383 and the test computer 384. The tester 38 may be electrically connected to the top circuit board 34 through the third terminal 381 and the first terminal 341. The sub-system 7 may be electrically connected to the tester 38 through the DSP circuit 382. The sub-system 7 includes an intermediate apparatus 71 and an up/down converter 72. The up/down converter 72 is electrically connected to the intermediate apparatus 71 and electrically connected to the tester 38 through the DSP circuit 382. In one embodiment, the intermediate apparatus 71 is electrically connected to the first measurement module 61 through the first connector 661, is electrically connected to the second measurement module 62 through the second connector 662, and is electrically connected to the third measurement module 63 through the third connector 663. In addition, the intermediate apparatus 71 is electrically connected to the fourth measurement module 64 through a fourth connector 664 (FIG. 13), and is electrically connected to the fifth measurement module 65 through a fifth connector 665 (FIG. 13).

Then, the assembly of the DUT 4, the top circuit board 34, the handler arm 30, the chuck 32, the connecting socket 35 and the top absorber 36 are moved downward. Thus, as shown in FIG. 9, the DUT 4 can be disposed in the receiving portion 21 of the device holder 2 disposed on the testing socket 12. The device holder 2 accommodates a lower surface (e.g., the second surface 42) of the DUT 4 and the lateral side surface 47 of the DUT 4. Meanwhile, the intermediate apparatus 71 is in communication with the DUT 4 since the measurement modules (including, for example, the first measurement module 61, the second measurement module 62, the third measurement module 63, the fourth measurement module 64 and the fifth measurement module 65) face the pattern of the antenna 46 (including, for example, the first radiation source/receiver 461, the second radiation source/receiver 462, the third radiation source/receiver 463, the fourth radiation source/receiver 464 and the fifth radiation source/receiver 465) respectively.

FIG. 13 illustrates a schematic circuit diagram performing a first operation method and a second operation method of the testing system 3 according to some embodiments of the present disclosure. In the embodiment illustrated in FIG. 13, the sub-system 7 includes the intermediate apparatus 71 and the up/down converter 72. The intermediate apparatus 71 includes a switch control circuit 710, a plurality of input ports (including, for example, a first input port 711, a second input port 712, a third input port 713, a fourth input port 714 and a fifth input port 715) and an output port 716. The switch control circuit 710 may include one or more switches to control the electrical connections between the input ports (including, for example, the first input port 711, the second input port 712, the third input port 713, the fourth input port 714 and the fifth input port 715) and the output port 716. The input ports (including, for example, the first input port 711, the second input port 712, the third input port 713, the fourth input port 714 and the fifth input port 715) are in communication with the DUT 4. The up/down converter 72 is electrically connected to the intermediate apparatus 71 through the output port 716. In the embodiment illustrated in FIG. 13, a single one of the input ports (including, for example, the first input port 711, the second input port 712, the third input port 713, the fourth input port 714 and the fifth input port 715) is electrically connected to the output port 716 through the control of the switch control circuit 710.

The first operation method is described as follows. For example, under a first testing mode of the first operation method, the emitting function of the DUT 4 is tested. The bottom circuit board 50 and/or the tester 38 can control the switch control circuit 710 and the DUT 4 simultaneously. When the antenna 46 of the DUT 4 is controlled to emit signals with high frequency waves (e.g., mmWaves having a wavelength on the order of millimeters) from one radiation source/receiver (e.g., the first radiation source/receiver 461 of the DUT 4), the bottom circuit board 50 and/or the tester 38 controls the switch control circuit 710 to electrically connect the first input port 711 and the output port 716. That is, there is one electrical connection path between the first input port 711 and the output port 716 in the intermediate apparatus 71. The other input ports (including, for example, the second input port 712, the third input port 713, the fourth input port 714 and the fifth input port 715) are not electrically connected to the output port 716. Meanwhile, the corresponding measurement module (e.g., the first measurement module 61) will receive the signals. Then, the signals from the measurement module (e.g., the first measurement module 61) may be lowered to an intermediate frequency by the up/down converter 72. Then, the DSP circuit 382 processes the signals from the sub-system 7 to be digital signals and transmits the digital signals to the tester 38. Finally, the tester 38 can determine whether a desired emitting function of the first radiation source/receiver 461 of the DUT 4 is achieved according to an analysis of the signals from the DSP circuit 382 and the up/down converter 72. That is, the tester 38 determines the received signals to be "pass" or "fail". If the result is "pass", it means the emitting function of the first radiation source/receiver 461 of the DUT 4 is normal (or qualified). If the result is "fail", it means the emitting function of the first radiation source/receiver 461 of the DUT 4 is abnormal (or unqualified). In the same way, the emitting function of the second radiation source/receiver 462 of the DUT 4 can be tested under the other path (e.g., electrical connection path between the second input port 712 and the output port 716). Therefore, the other radiation source/receiver (e.g., the third radiation source/receiver 463, the fourth radiation source/receiver 464 and the fifth radiation source/receiver 465) of the DUT 4 can be tested in the same way.

Similarly, the receiving function of the DUT 4 can be tested by a reverse way. That is, under a second testing mode of the first operation method, the receiving function of the DUT 4 is tested as follows. The tester 38 processes intermediate frequency signals to high frequency signals (e.g., mmWaves) by the DSP circuit 382 and the up/down converter 72. Then, the bottom circuit board 50 and/or the tester 38 control the first measurement module 61 to emit the high frequency signals. The frequency signals emitted from the first measurement module 61 may be received by the first radiation source/receiver 461 of the DUT 4. Finally, the tester 38 can determine whether a desired receiving function of the first radiation source/receiver 461 of the DUT 4 is achieved according to an analysis of the signals from the DUT 4.

In the embodiment illustrated in FIG. 13, in view of the design of the intermediate apparatus 71, one up/down converter 72 is included. Thus, the testing cost is reduced.

In addition, the embodiment illustrated in FIG. 13 can accomplish a second operation method described as follows. For example, under a first testing mode of the second operation method, the emitting function of the DUT 4 is tested. The bottom circuit board 50 and/or the tester 38 can control the switch control circuit 710 and the DUT 4 simultaneously. When the antenna 46 of the DUT 4 is controlled to emit signals with high frequency waves (e.g., mmWaves having a wavelength on the order of millimeters) from an unknown radiation source/receiver, the bottom circuit board 50 and/or the tester 38 controls the switch control circuit 710 to process a polling operation. That is, during a period of time, the switch control circuit 710 switches all of the input ports (including, for example, the first input port 711, the second input port 712, the third input port 713, the fourth input port 714 and the fifth input port 715). If the signals from an input port (for example, the third input port 713) and its corresponding measurement module (e.g., the third measurement module 63) are preferable, the electrical connection path between such input port (for example, the third input port 713) and the output port 716 is fixed. Meanwhile, the unknown radiation source/receiver of the DUT 4 can be determined to be the third radiation source/receiver 463 of the DUT 4. Then, the signals from the measurement module (e.g., the third measurement module 63) may be lowered to an intermediate frequency by the up/down converter 72. Then, the DSP circuit 382 processes the signals from the sub-system 7 to be digital signals and transmits the digital signals to the tester 38. Finally, the tester 38 can determine whether a desired emitting function of the third radiation source/receiver 463 of the DUT 4 is achieved according to an analysis of the signals from the DSP circuit 382 and the up/down converter 72.

Similarly, the receiving function of the third radiation source/receiver 463 of the DUT 4 can be tested by a reverse way. That is, under a second testing mode of the second operation method, the receiving function of the third radiation source/receiver 463 of the DUT 4 is tested as follows. The tester 38 processes intermediate frequency signals to high frequency signals (e.g., mmWaves) by the DSP circuit 382 and the up/down converter 72. Then, the bottom circuit board 50 and/or the tester 38 control the third measurement module 63 to emit the high frequency signals. The frequency signals emitted from the third measurement module 63 may be received by the third radiation source/receiver 463 of the DUT 4. Finally, the tester 38 can determine whether a desired receiving function of the third radiation source/receiver 463 of the DUT 4 is achieved according to an analysis of the signals from the DUT 4.

In addition, the emitting function and receiving function of the other radiation source/receiver (e.g., the first radiation source/receiver 461, the second radiation source/receiver 462, the fourth radiation source/receiver 464 and the fifth radiation source/receiver 465) of the DUT 4 can be tested in the same way.

Figure 14:
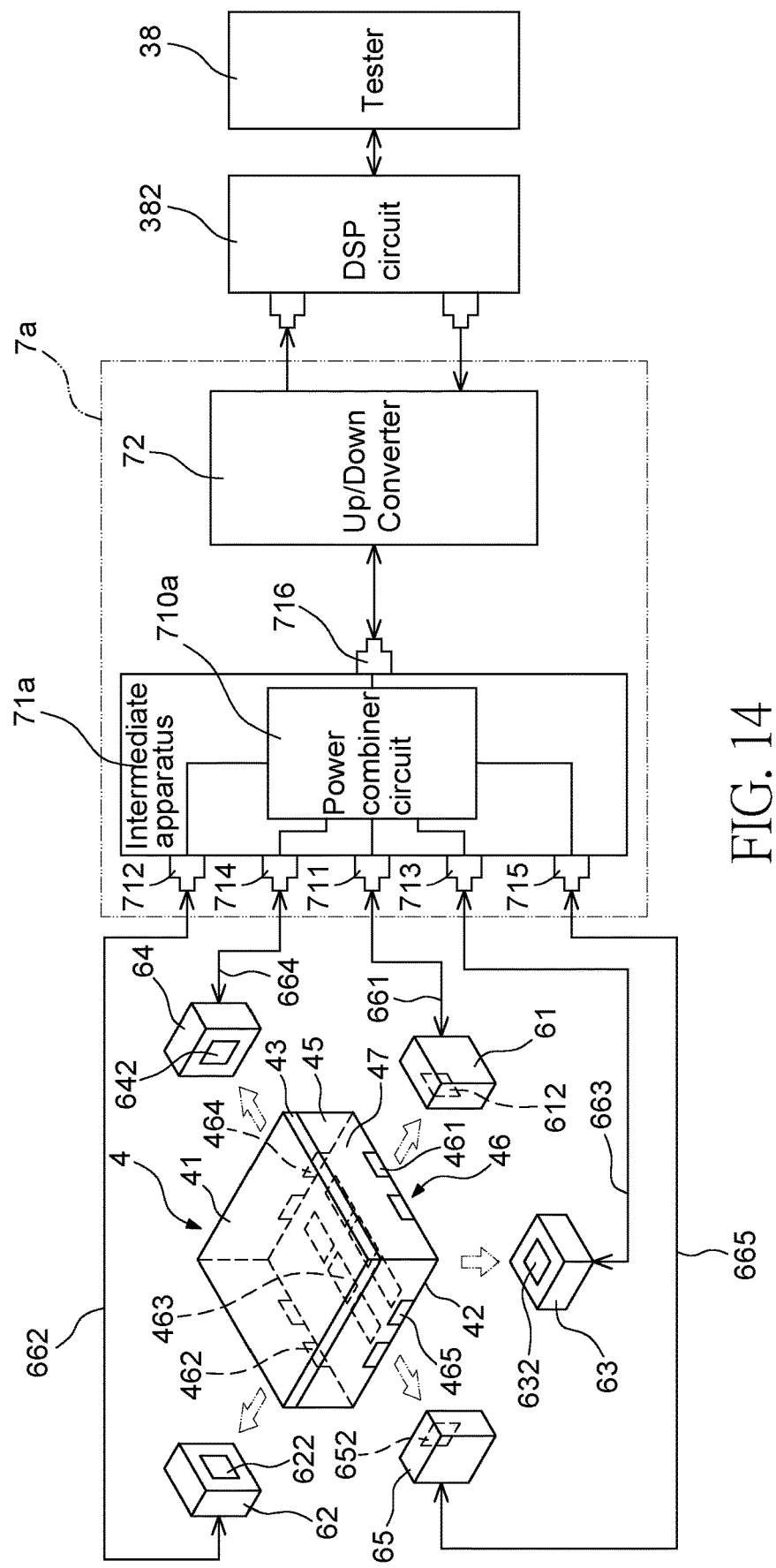
FIG. 14 illustrates a schematic circuit diagram performing a third operation method of the testing system according to some embodiments of the present disclosure.

FIG. 14 illustrates a schematic circuit diagram performing a third operation method of the testing system 3 according to some embodiments of the present disclosure. The schematic circuit diagram shown in FIG. 14 is similar to the schematic circuit diagram shown in FIG. 13, and the difference therebetween is described as follows. In the embodiment illustrated in FIG. 14, the sub-system 7a includes the intermediate apparatus 71a and the up/down converter 72. The intermediate apparatus 71a includes a power combiner circuit 710a, the input ports (including, for example, a first input port 711, a second input port 712, a third input port 713, a fourth input port 714 and a fifth input port 715) and the output port 716. All of the input ports (including, for example, the first input port 711, the second input port 712, the third input port 713, the fourth input port 714 and the fifth input port 715) are electrically connected to the output port 716 through the power combiner circuit 710a. That is, the electrical connection paths between all of the input ports (including, for example, the first input port 711, the second input port 712, the third input port 713, the fourth input port 714 and the fifth input port 715) and the output port 716 exist at the same time.

The third operation method is described as follows. For example, under a first testing mode of the third operation method, the emitting function of the DUT 4 is tested. The bottom circuit board 50 and/or the tester 38 can control the power combiner circuit 710a and the DUT 4 simultaneously. When the antenna 46 of the DUT 4 is controlled to emit signals with high frequency waves (e.g., mmWaves having a wavelength on the order of millimeters) from one radiation source/receiver (e.g., the first radiation source/receiver 461 of the DUT 4), the corresponding measurement module (e.g., the first measurement module 61) will receive the signals. Then, the signals from the measurement module (e.g., the first measurement module 61) may be lowered to an intermediate frequency by the up/down converter 72. Then, the DSP circuit 382 processes the signals from the sub-system 7a to be digital signals and transmits the digital signals to the tester 38. Finally, the tester 38 can determine whether a desired emitting function of the first radiation source/receiver 461 of the DUT 4 is achieved according to an analysis of the signals from the DSP circuit 382 and the up/down converter 72. In addition, the emitting function of the other radiation source/receiver (e.g., the second radiation source/receiver 462, the third radiation source/receiver 463, the fourth radiation source/receiver 464 and the fifth radiation source/receiver 465) of the DUT 4 can be tested in the same way. Similarly, the receiving function of the DUT 4 can be tested by a reverse way.

Figure 15:
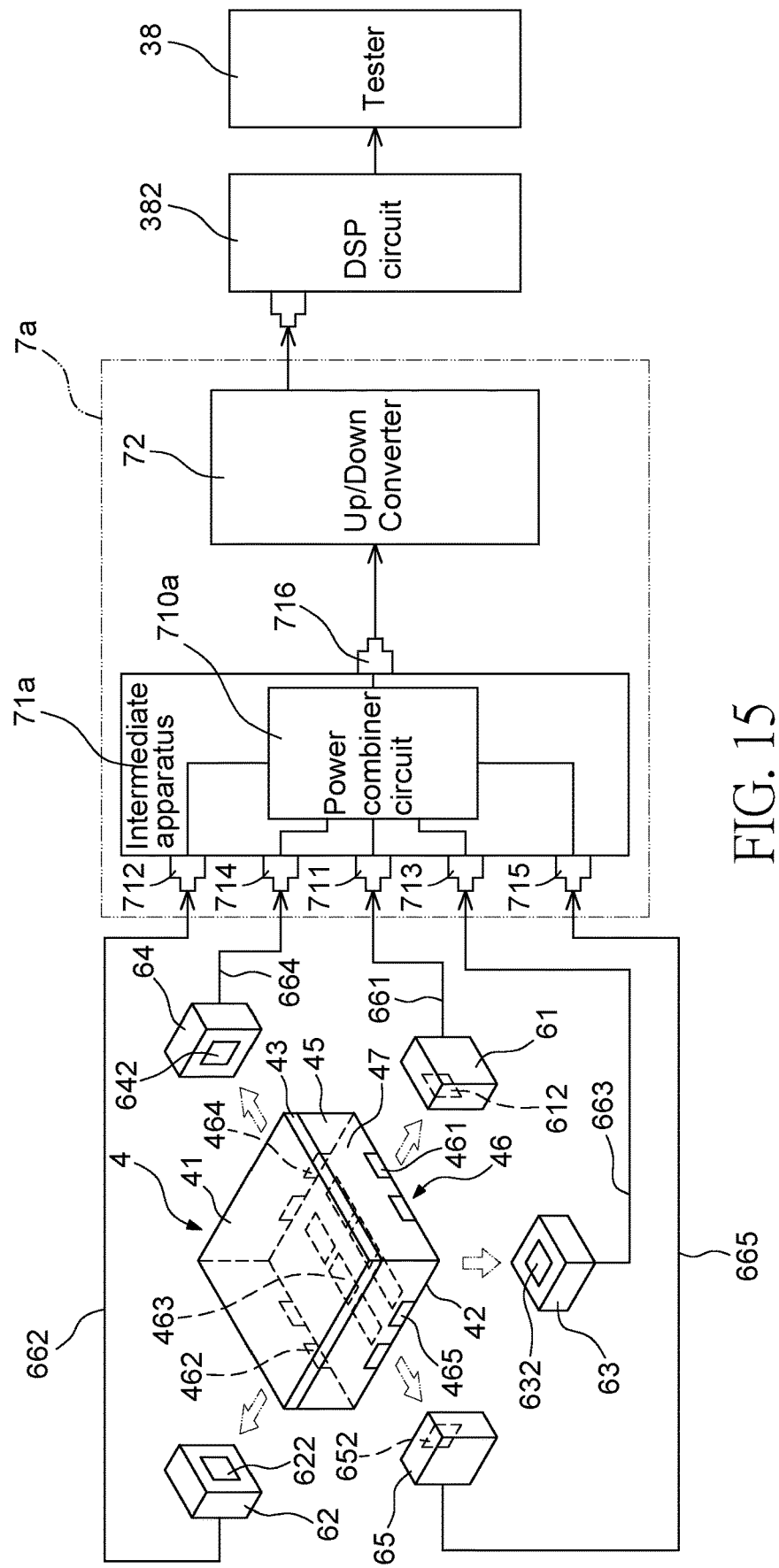
FIG. 15 illustrates a schematic circuit diagram performing a fourth operation method of the testing system according to some embodiments of the present disclosure.

FIG. 15 illustrates a schematic circuit diagram performing a fourth operation method of the testing system 3 according to some embodiments of the present disclosure. The schematic circuit diagram shown in FIG. 15 is similar to the schematic circuit diagram shown in FIG. 14, and the difference therebetween is described as follows. The fourth operation method is described as follows. For example, under a first testing mode of the fourth operation method, the emitting function of the DUT 4 is tested. The bottom circuit board 50 and/or the tester 38 can control the power combiner circuit 710a and the DUT 4 simultaneously. The antenna 46 of the DUT 4 is controlled to emit signals with high frequency waves (e.g., mmWaves having a wavelength on the order of millimeters) from all of the radiation sources/receivers (e.g., the first radiation source/receiver 461, the second radiation source/receiver 462, the third radiation source/receiver 463, the fourth radiation source/receiver 464 and the fifth radiation source/receiver 465 of the DUT 4) at the same time. Then, all of the corresponding measurement modules (e.g., the first measurement module 61, the second measurement module 62, the third measurement module 63, the fourth measurement module 64 and the fifth measurement module 65) will receive the signals. Then, the signals from all of the corresponding measurement modules (e.g., the first measurement module 61, the second measurement module 62, the third measurement module 63, the fourth measurement module 64 and the fifth measurement module 65) may be lowered to an intermediate frequency by the up/down converter 72. Then, the DSP circuit 382 processes the signals from the sub-system 7a to be digital signals and transmits the digital signals to the tester 38. That is, the powers of the signals from all of the corresponding measurement modules (e.g., the first measurement module 61, the second measurement module 62, the third measurement module 63, the fourth measurement module 64 and the fifth measurement module 65) will be accumulated together. Finally, the tester 38 can determine whether a desired emitting function of the DUT 4 is achieved according to an analysis of the total signals (e.g., the sum of the powers) from the DSP circuit 382 and the up/down converter 72.

The fourth operation method can reduce the testing time and the complication as compared with the above-mentioned first operation method, second operation method and third operation method. However, the fourth operation method may not determine which one of the radiation source/receiver of the DUT 4 is "pass" or "fail". In addition, the receiving function of the DUT 4 may not be tested by a reverse way.

Figure 16:
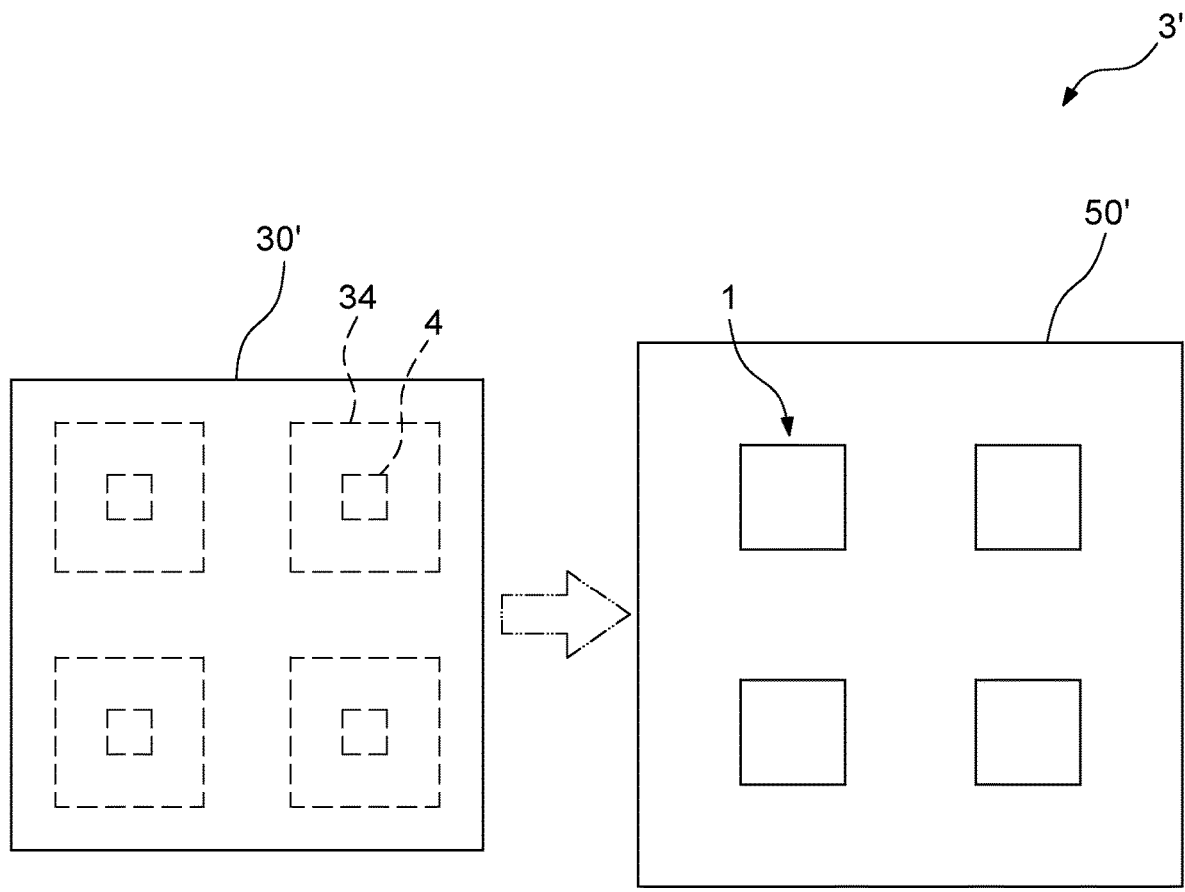
FIG. 16 illustrates a schematic view of a testing system according to some embodiments of the present disclosure.

FIG. 16 illustrates a schematic view of a testing system 3' according to some embodiments of the present disclosure. The testing system 3' may include four DUTs 4, four top circuit boards 34, a handler arm 30', four testing devices 1 and a bottom circuit board 50'. Each of the DUTs 4 corresponds to a respective one of the top circuit boards 34, and the four DUTs 4 and the four top circuit boards 34 may be handled by one handler arm 30'. The four testing devices 1 may be disposed on one bottom circuit board 50'. The handler arm 30' with the four DUTs 4 and the four top circuit boards 34 may be moved to cover the four testing devices 1, and each of the DUTs 4 is disposed in each of the testing devices 1. Therefore, the testing system 3' can provide for multi-site testing, and the signals in one testing device 1 may not significantly influence an adjacent testing device 1. In some embodiments, more than four DUTs 4, or less than four DUTs 4, can be tested in a multi-site test using a suitable apparatus.

Figure 17:
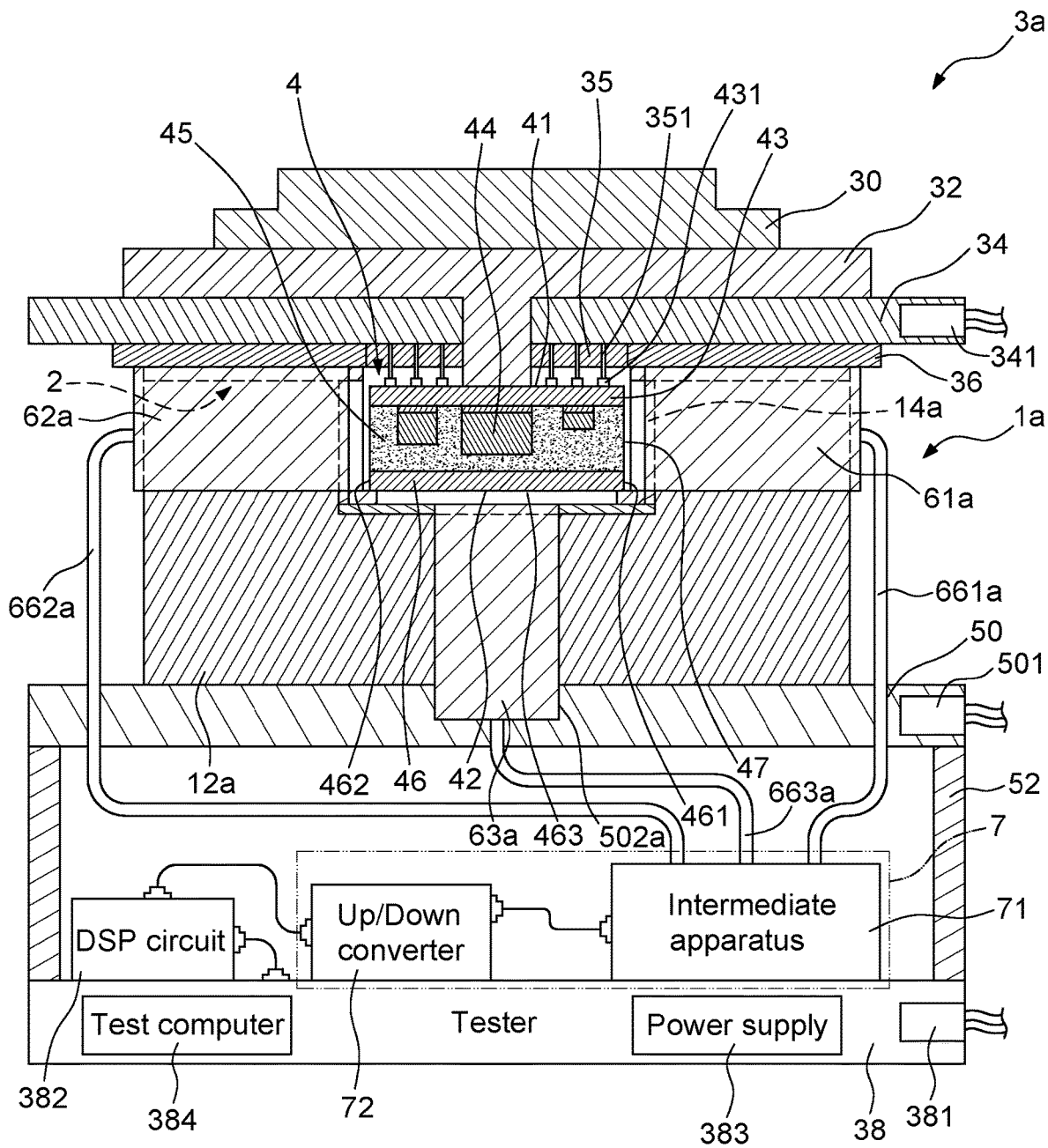
FIG. 17 illustrates a cross-sectional view of a testing system according to some embodiments of the present disclosure.
Figure 18:
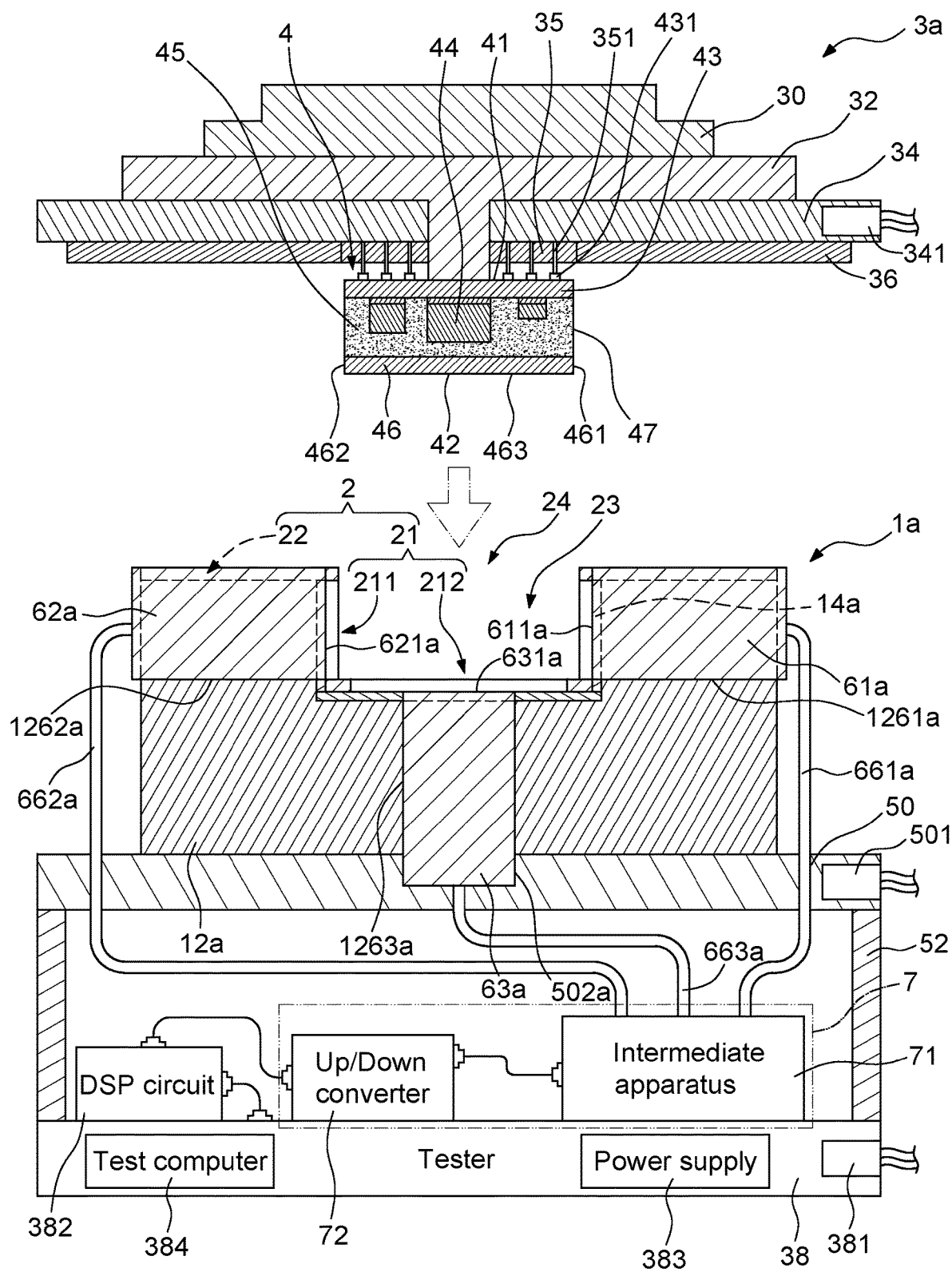
FIG. 18 illustrates an exploded perspective view of a testing system of FIG. 17.
Figure 19:
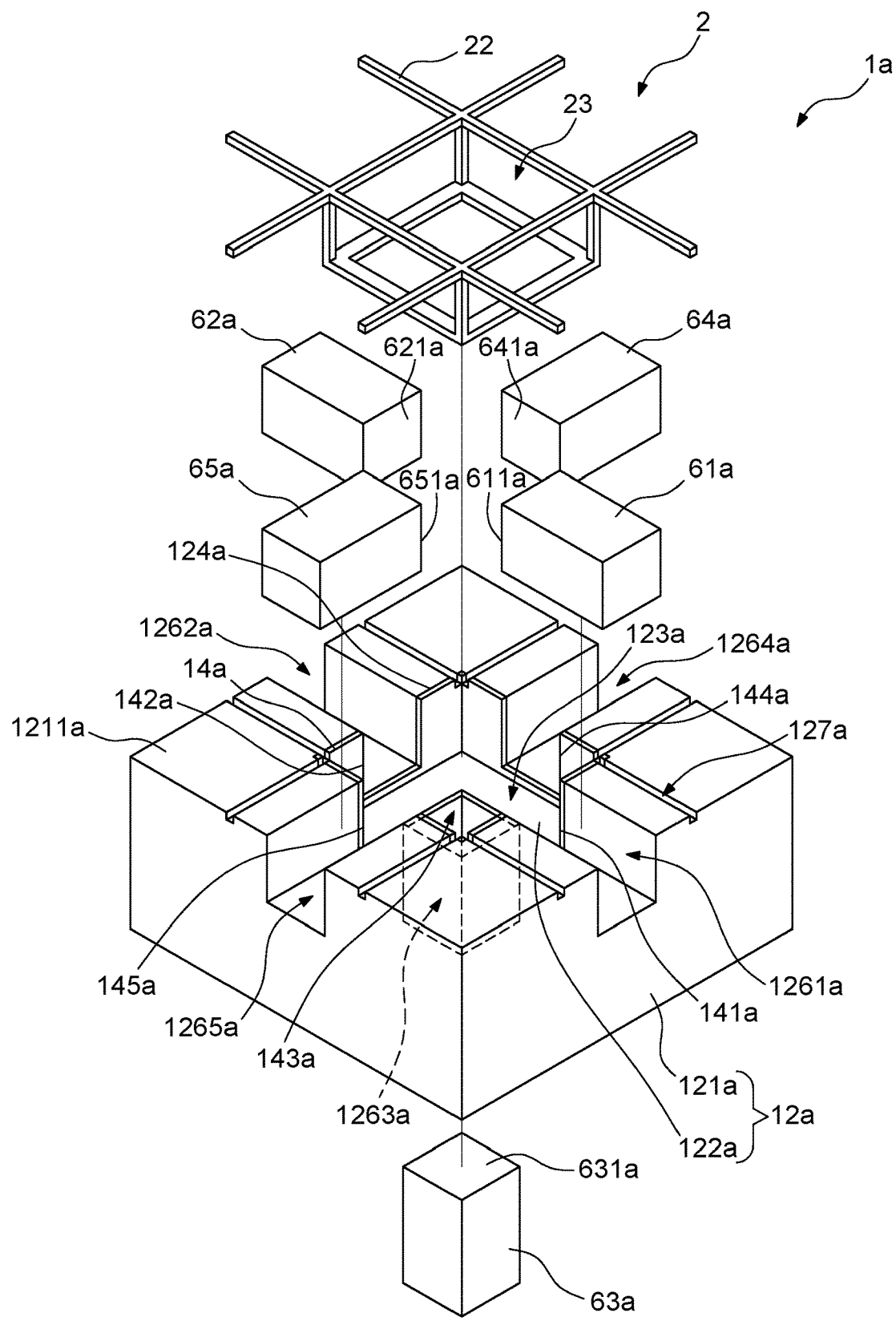
FIG. 19 illustrates an exploded perspective view of a testing device of FIG. 17 and FIG. 18.

FIG. 17 illustrates a cross-sectional view of a testing system 3a according to some embodiments of the present disclosure. FIG. 18 illustrates an exploded perspective view of a testing system 3a of FIG. 17. FIG. 19 illustrates an exploded perspective view of a testing device 1a of FIG. 17 and FIG. 18. The testing system 3a of FIG. 17 and FIG. 18 is similar to the testing system 3 of FIG. 9 and FIG. 12, except for the structure of the testing device 1a.

Referring to FIG. 19, the testing device 1a includes a testing socket 12a, a device holder 2, an absorber 14a, a plurality of measurement modules (including, for example, a first measurement module 61a, a second measurement module 62a, a third measurement module 63a, a fourth measurement module 64a and a fifth measurement module 65a). The testing socket 12a defines a radiation space 123a, and a plurality of accommodating openings (including, for example, a first accommodating opening 1261a, a second accommodating opening 1262a, a third accommodating opening 1263a, a fourth accommodating opening 1264a and a fifth accommodating opening 1265a). The radiation space 123a and the accommodating openings (including, for example, the first accommodating opening 1261a, the second accommodating opening 1262a, the third accommodating opening 1263a, the fourth accommodating opening 1264a and the fifth accommodating opening 1265a) are in communication with each other.

In some embodiments, the testing socket 12a includes one or more side walls 121a (e.g. four side walls 121a) and a bottom wall 122a. The side walls 121a may connect to the bottom wall 122a to define the radiation space 123a. Each of the side walls 121a may define an accommodating opening (including, for example, the first accommodating opening 1261a, the second accommodating opening 1262a, the fourth accommodating opening 1264a and the fifth accommodating opening 1265a). The bottom wall 122a may define an accommodating opening (including, for example, the third accommodating opening 1263a). Each of the side walls 121a (e.g. four side walls 121a) and the bottom wall 122a has an inner surface 124a. Thus, the inner surfaces 124a of the side walls 121a (e.g. four side walls 121a) and the bottom wall 122a define the radiation space 123a.

As shown in FIG. 19, the first accommodating opening 1261a, the second accommodating opening 1262a, the fourth accommodating opening 1264a and the fifth accommodating opening 1265a may be located at a top portion of the side walls 121a and may extend through the side walls 121a. The third accommodating opening 1263a may be located at a center of the bottom wall 122a and may extend through the bottom wall 122a. In some embodiments, the side walls 121a and the bottom wall 122a are separate walls that are assembled together by, for example, screw. In some embodiments, the side walls 121a and the bottom wall 122a may be formed integrally as a monolithic structure. In addition, the testing socket 12a may further define a plurality of slots 127a in a top (e.g., an upper surface 1211a) of the side walls 121a for receiving an extending portion 22 of the device holder 2.

The absorber 14a is disposed on the inner surfaces 124a of the side walls 121a (e.g. four side walls 121a) and the bottom wall 122a of the testing socket 12a to define the radiation space 123a. As shown in FIG. 19, the absorber 14a defines a plurality of openings (including, for example, a first opening 141a, a second opening 142a, a third opening 143a, a fourth opening 144a and a fifth opening 145a) corresponding to the accommodating openings (including, for example, the first accommodating opening 1261a, the second accommodating opening 1262a, the third accommodating opening 1263a, the fourth accommodating opening 1264a and the fifth accommodating opening 1265a) of the testing socket 12a, respectively. The absorber 14a may be an electromagnetic wave absorbing material (such as polymer with metal particles dispersed therein), and may be formed in a plate shape. The absorber 14a is attached on the inner surfaces 124a of the testing socket 12a by, for example, adhesion. Thus, the inner surface 124a of the testing socket 12a (with the absorber 14a) is a wave absorbing surface. In one embodiment, the absorber 14a may be formed on the inner surface 124a of the testing socket 12a by, for example, coating. The absorber 14a may absorb the electromagnetic wave having a frequency of 25 GHz to 80 GHz.

The device holder 2 of FIG. 17 to FIG. 19 is same as the device holder 2 of FIG. 3 and FIG. 4. The device holder 2 is disposed in the radiation space 123a, and is supported by the testing socket 12a. In some embodiments, the extending portion 22 of the device holder 2 may be positioned in, or couple with, the slot 127a of the side wall 121a of the testing socket 12a. Thus, the device holder 2 may be disposed in the radiation space 123, so that the accommodating space 23 is surrounded by the absorber 14a, and the measurement modules (including, for example, the first measurement module 61a, the second measurement module 62a, the third measurement module 63a, the fourth measurement module 64a and the fifth measurement module 65a) face the accommodating space 23 of the device holder 2.

The measurement modules (including, for example, the first measurement module 61a, the second measurement module 62a, the third measurement module 63a, the fourth measurement module 64a and the fifth measurement module 65a) are disposed in a respective one of the accommodating openings (including, for example, the first accommodating opening 1261a, the second accommodating opening 1262a, the third accommodating opening 1263a, the fourth accommodating opening 1264a and the fifth accommodating opening 1265a) of the side walls 121a and the bottom wall 122a, respectively. In addition, each of the measurement modules (including, for example, the first measurement module 61a, the second measurement module 62a, the third measurement module 63a, the fourth measurement module 64a and the fifth measurement module 65a) may include an emitter/receiver surface (including, for example, a first surface 611a, a second surface 621a, a third surface 631a, a fourth surface 641a and a fifth surface 651a) that is exposed from the opening of the absorber 14a and faces the receiving portion 21 of the device holder 2. In one embodiment, the measurement modules (including, for example, the first measurement module 61a, the second measurement module 62a, the third measurement module 63a, the fourth measurement module 64a and the fifth measurement module 65a) are waveguides or probe antenna types.

As shown in FIG. 17 and FIG. 18, the testing device 1a may further includes a first connector 661a, a second connector 662a, a third connector 663a, a fourth connector (not shown) and a fifth connector (not shown). The intermediate apparatus 71 of the sub-system 7 is electrically connected to the first measurement module 61a through the first connector 661a, is electrically connected to the second measurement module 62a through the second connector 662a, is electrically connected to the third measurement module 63a through the third connector 663a, is electrically connected to the fourth measurement module 64a through the fourth connector, and is electrically connected to the fifth measurement module 65a through the fifth connector 665.

The DUT 4, the top circuit board 34 (e.g., a test board), the handler arm 30, the chuck 32, the connecting socket 35, the top absorber 36, the tester 38, the bottom circuit board 50 (e.g., a load board), the board stiffener 52, the digital signal processor (DSP) circuit 382 and the sub-system 7 of the testing system 3a of FIG. 17 and FIG. 18 may be same as the DUT 4, the top circuit board 34 (e.g., a test board), the handler arm 30, the chuck 32, the connecting socket 35, the top absorber 36, the tester 38, the bottom circuit board 50 (e.g., a load board), the board stiffener 52, the digital signal processor (DSP) circuit 382 and the sub-system 7 of the testing system 3 of FIG. 9 and FIG. 12.

Figure 20:
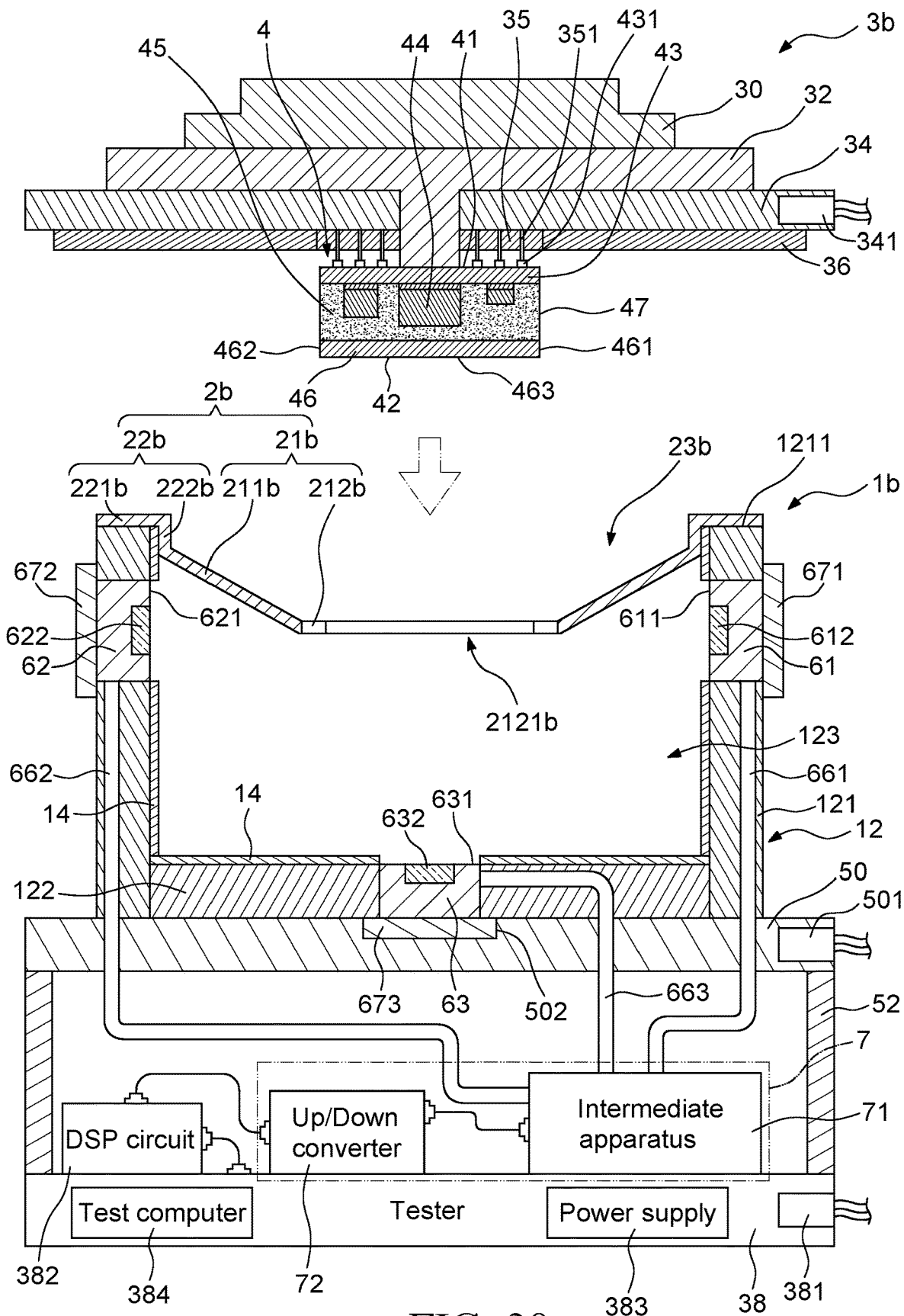
FIG. 20 illustrates a cross-sectional view of a testing system according to some embodiments of the present disclosure.
Figure 21:
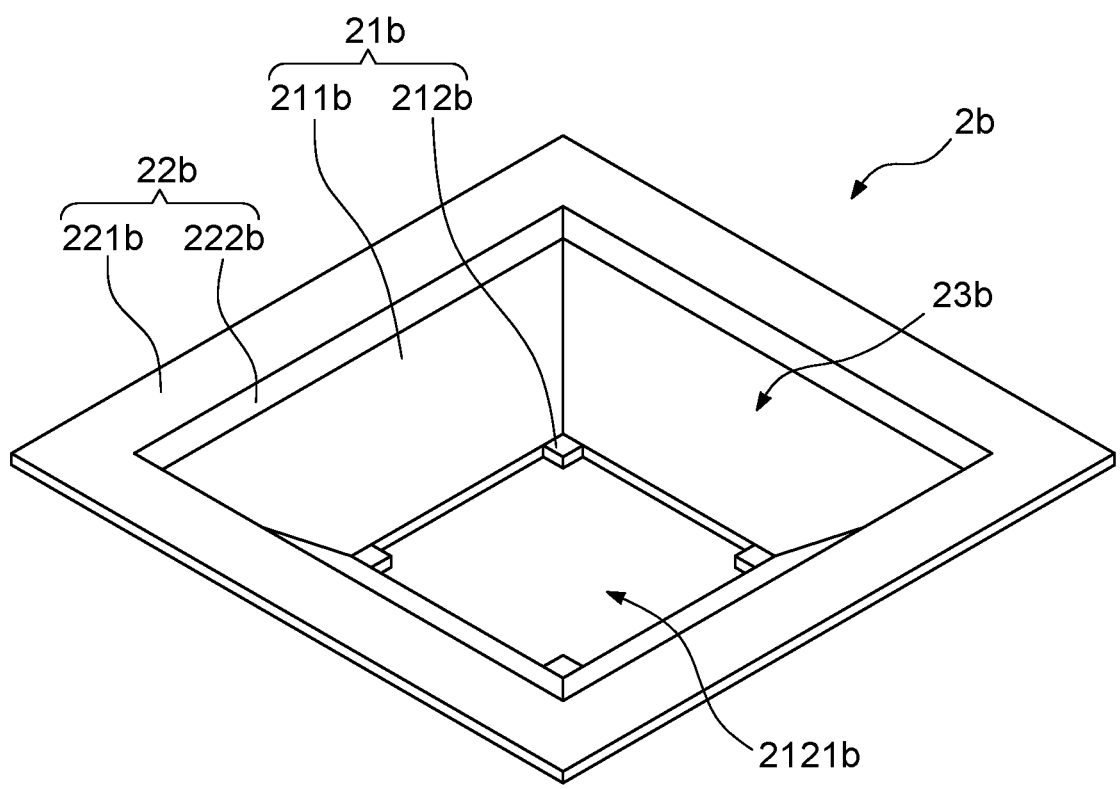
FIG. 21 illustrates a perspective view of a device holder of FIG. 20.

FIG. 20 illustrates a cross-sectional view of a testing system 3b according to some embodiments of the present disclosure. FIG. 21 illustrates a perspective view of a device holder 2b of FIG. 20. The testing system 3b of FIG. 20 is similar to the testing system 3 of FIG. 9 and FIG. 12, except for the structure of the device holder 2b of the testing device 1b.

The device holder 2b is disposed in the radiation space 123, and is supported by the testing socket 12. The device holder 2b includes a receiving portion 21b and an extending portion 22b. The receiving portion 21 defines an accommodating space 23b for receiving the DUT 4. The extending portion 22b extends from the receiving portion 21b to the upper surface 1211 of the testing socket 12. In some embodiments, the extending portion 22b may include a first portion 221b and a second portion 222b. The first portion 221b is in a horizontal ring shape and is disposed on the upper surface 1211 of the testing socket 12. The second portion 222b is in a vertical ring shape and is disposed on the inner surface of the absorber 14. The second portion 222b connects to the first portion 221b. The device holder 2b is disposed in the radiation space 123, so that the accommodating space 23b is surrounded by the absorber 14, and the measurement modules (including, for example, a first measurement module 61, a second measurement module 62 and a third measurement module 63) face the accommodating space 23b of the device holder 2b.

In addition, the receiving portion 21b of the device holder 2b includes at least one or more periphery portions 211b and at least one or more supporting portions 212b. The periphery portions 211b connect to the second portion 222b of the extending portion 22b. In one embodiment, the periphery portions 211b may be four slant side walls that define the accommodating space 23b and a lower opening 2121b. The supporting portions 212b may be four horizontal pads that connect to the bottom portion of the periphery portions 211b. Thus, the supporting portions 212b may be disposed at the four corners of the lower opening 2121b for supporting the four bottom corners of the DUT 4. In one embodiment, the device holder 2b may be formed integrally as a monolithic structure.

Figure 22:
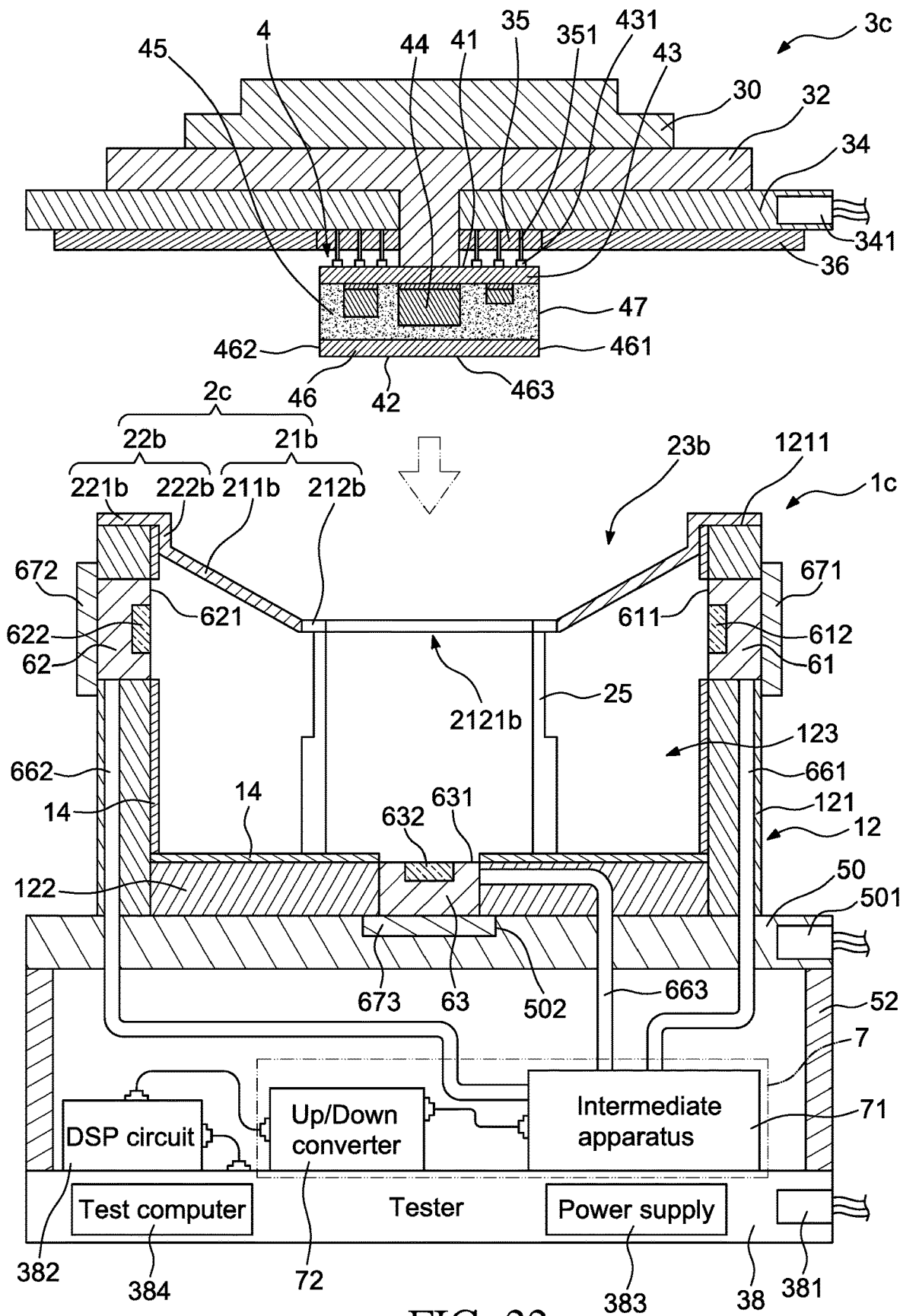
FIG. 22 illustrates a cross-sectional view of a testing system according to some embodiments of the present disclosure.
Figure 23:
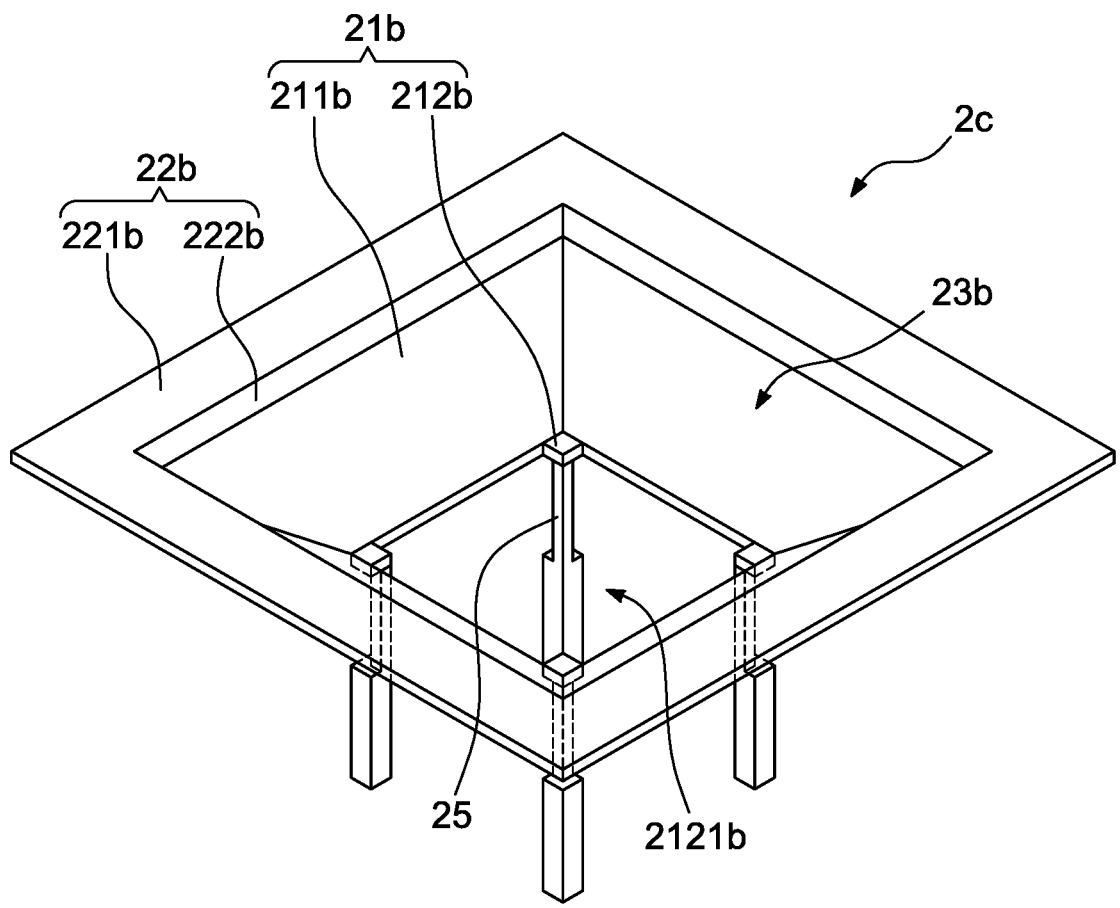
FIG. 23 illustrates a perspective view of a device holder of FIG. 22.

FIG. 22 illustrates a cross-sectional view of a testing system 3c according to some embodiments of the present disclosure. FIG. 23 illustrates a perspective view of a device holder 2c of FIG. 22. The testing system 3c of FIG. 22 is similar to the testing system 3b of FIG. 20, except for the structure of the device holder 2c of the testing device 1c. The device holder 2c of FIG. 22 and FIG. 23 is similar to the device holder 2b of FIG. 20 and FIG. 21, and the differences are described as follows. The device holder 2c of FIG. 22 and FIG. 23 further includes four sustain pillars 25. A top end of each of the sustain pillars 25 connects to each of the supporting portions 212b. A bottom end of the sustain pillar 25 contact the absorber 14 on the bottom wall 122 of the testing socket 12. That is, a portion (e.g., the bottom end of the sustain pillar 25) of the device holder 2c extends to a bottom portion of the testing socket 12. The sustain pillars 25 can increase the supporting force of the supporting portions 212b when the DUT 4 is disposed on the supporting portions 212b. In one embodiment, the device holder 2c may be formed integrally as a monolithic structure.

Figure 24:
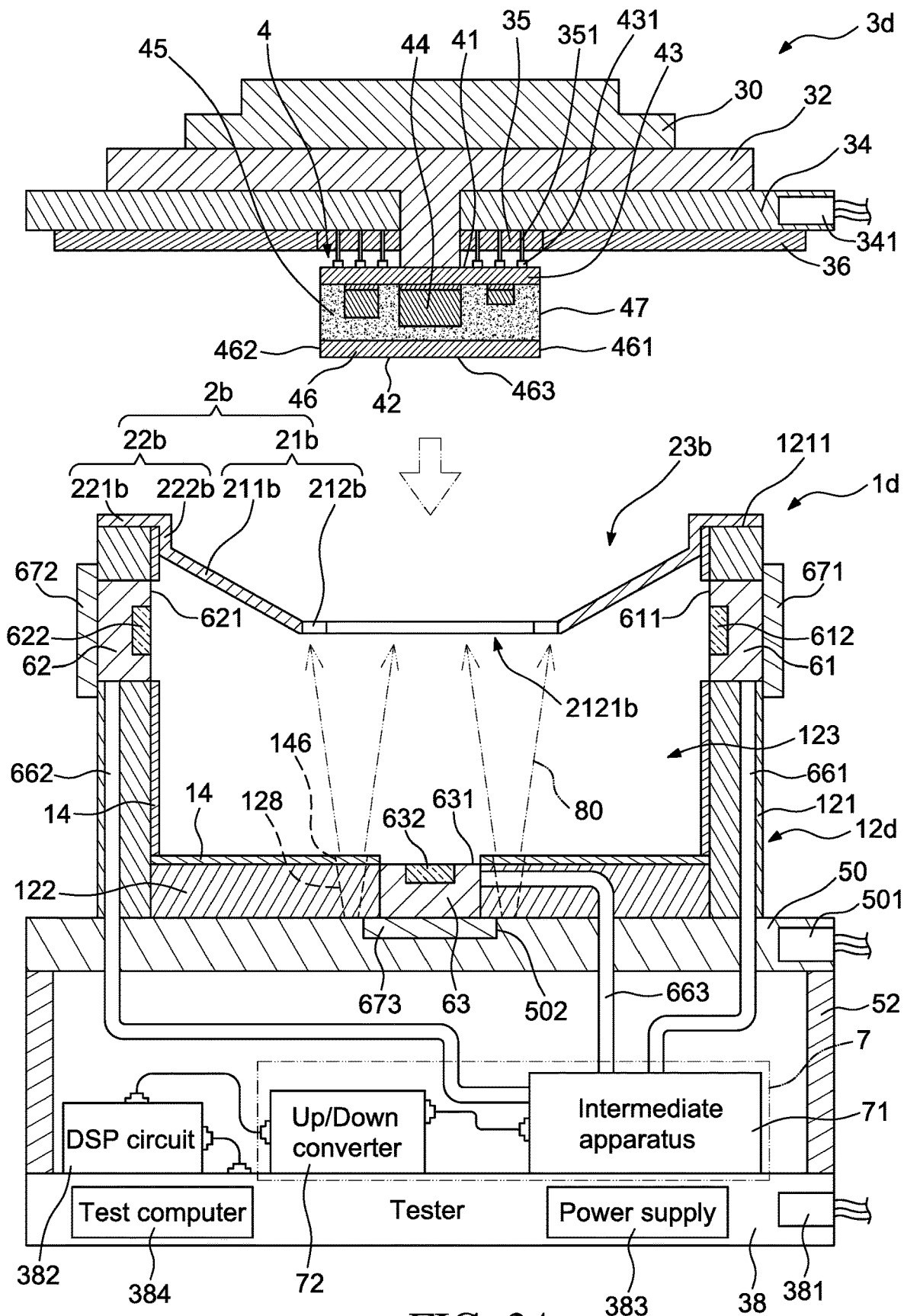
FIG. 24 illustrates a cross-sectional view of a testing system according to some embodiments of the present disclosure.

FIG. 24 illustrates a cross-sectional view of a testing system 3d according to some embodiments of the present disclosure. The testing system 3d of FIG. 24 is similar to the testing system 3b of FIG. 20, except for the structure of the testing socket 12d of the testing device 1d. The testing socket 12d of FIG. 24 is similar to the testing socket 12d of FIG. 20, and the differences are described as follows. The testing socket 12d of FIG. 24 further defines at least one air vent 128 at a bottom portion (e.g., the bottom wall 122) thereof, and the absorber 14 on the bottom wall 122 further defines at least one air vent 146 corresponding to the air vent 128 of the testing socket 12d. At least one air flow 80 flows from a bottom of the testing socket 12d to the device holder 2b through the air vents 128, 146. The air flow 80 can increase the supporting force of the supporting portions 212b when the DUT 4 is disposed on the supporting portions 212b.

Figure 25:
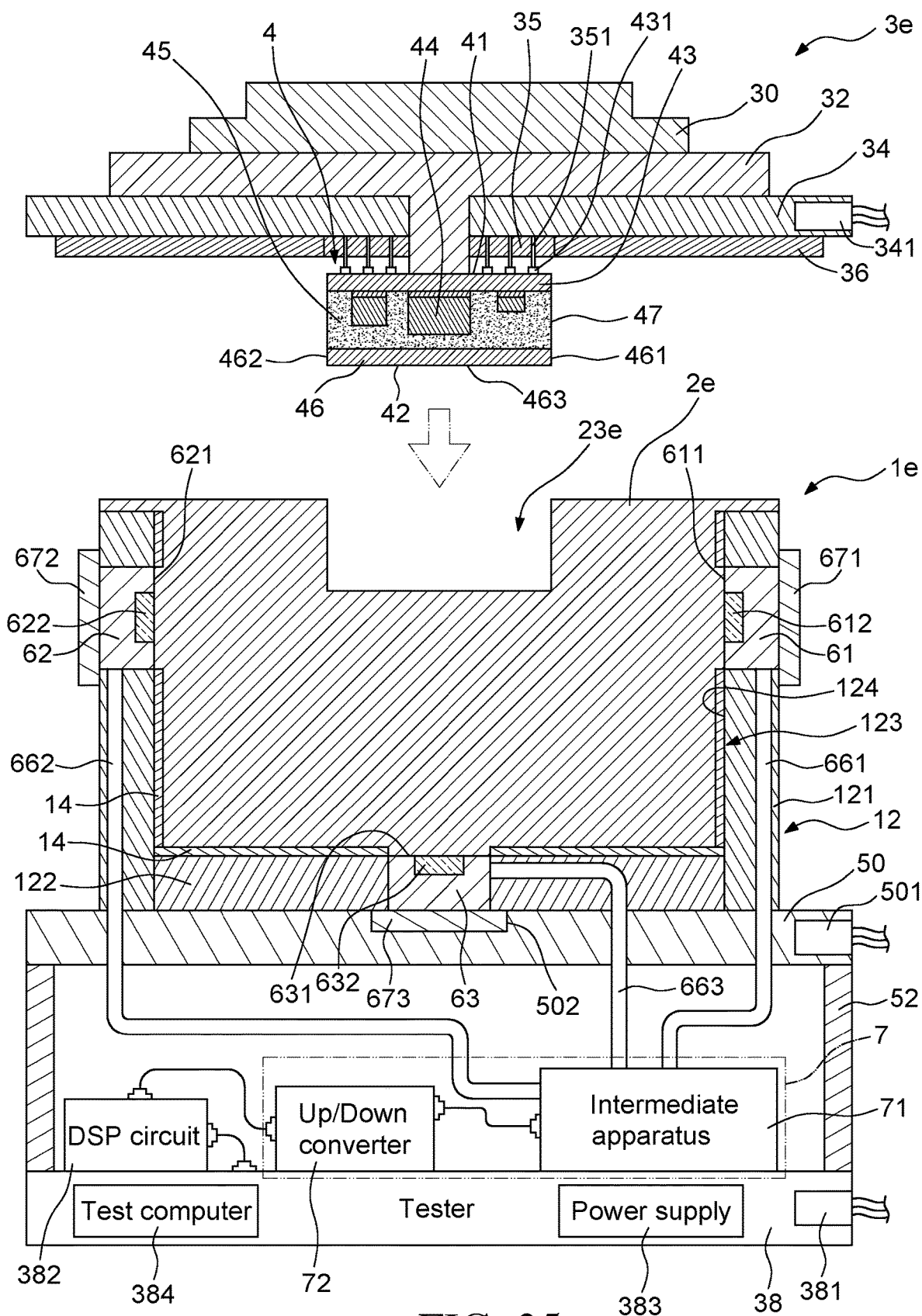
FIG. 25 illustrates a cross-sectional view of a testing system according to some embodiments of the present disclosure.

FIG. 25 illustrates a cross-sectional view of a testing system 3e according to some embodiments of the present disclosure. The testing system 3e of FIG. 25 is similar to the testing system 3 of FIG. 9 and FIG. 12, except for the structure of the device holder 2e of the testing device 1e. The device holder 2e extends adjacent to the inner surface 124 of the testing socket 12. In one embodiment, the device holder 2e fills the radiation space 123 defined by the absorber 14 of the testing socket 12, thus, the device holder 2e contacts the absorber 14. The device holder 2e defines an accommodating space 23e recessed from the upper surface thereof for receiving the DUT 4. The size of the accommodating space 23e may be substantially equal to the size of the DUT 4. Alternatively, the size of the accommodating space 23e may be greater than the size of the DUT 4. The device holder 2e may be a solid block structure. In some embodiments, a material of the device holder 2e may include a plastic, wood, an acrylic or an aerogel.

Figure 26:
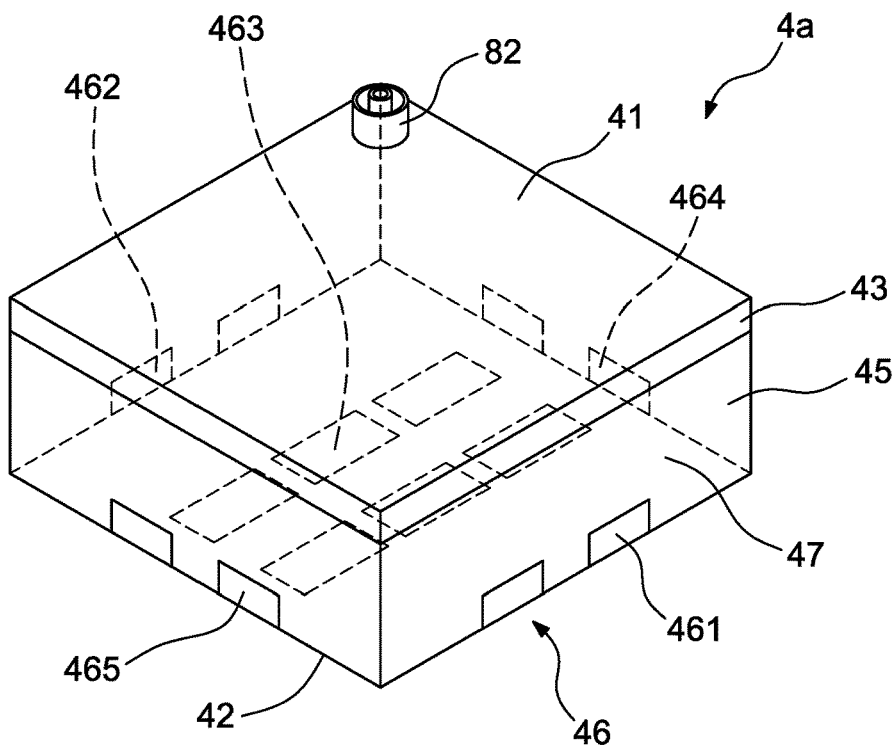
FIG. 26 illustrates a perspective view of a DUT according to some embodiments of the present disclosure.

FIG. 26 illustrates a perspective view of a DUT 4a according to some embodiments of the present disclosure. The DUT 4a of FIG. 26 is similar to the DUT 4 of FIG. 10, except that the DUT 4a further includes a connector 82 and does not include the electrical contacts 431 (e.g., solder balls or solder bumps) of FIG. 10. That is, the electrical contacts 431 (e.g., solder balls or solder bumps) of FIG. 10 are replaced by the connector 82. The connector 82 is disposed adjacent to the upper surface thereof (e.g., the first surface 41), and the antenna 46 is disposed adjacent to the second surface 42 of the DUT 4a. Thus, the connector 82 and the antenna 46 are disposed on different sides of the DUT 4a. The connector 82 is electrically connected to the substrate 43, and is used for external connection. In some embodiments, the connector 82 may be an IPEX connector or a FPC connector.

Figure 27:
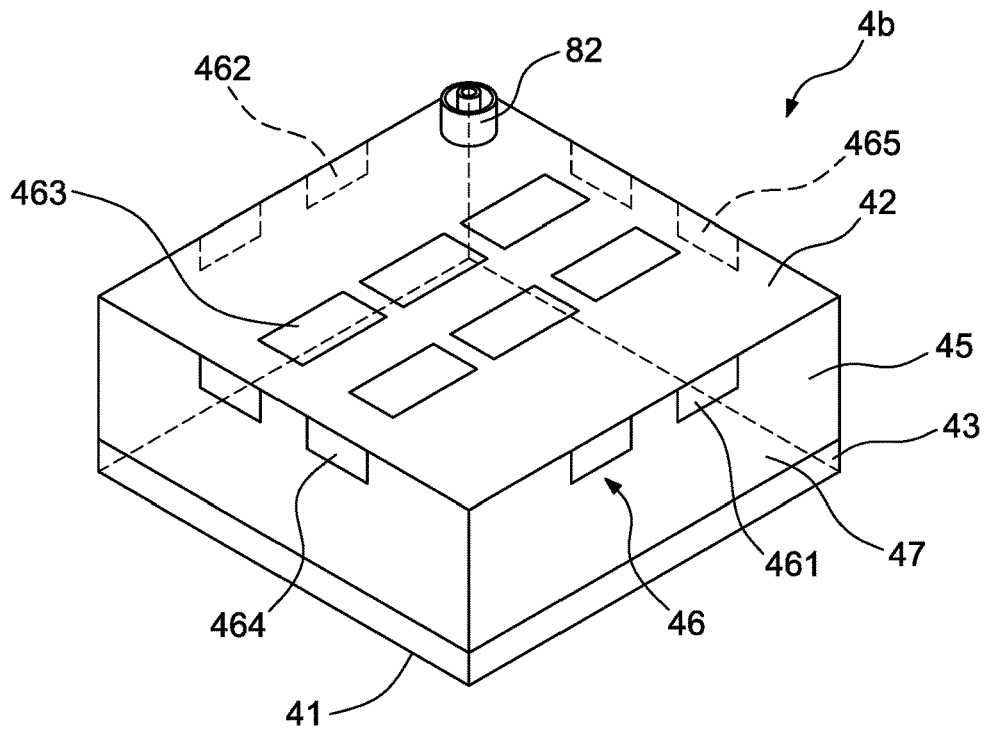
FIG. 27 illustrates a bottom perspective view of a DUT according to some embodiments of the present disclosure.

FIG. 27 illustrates a bottom perspective view of a DUT 4b according to some embodiments of the present disclosure. The DUT 4b of FIG. 27 is similar to the DUT 4a of FIG. 26, except that the connector 82 and the antenna 46 are disposed on the same side of the DUT 4b. In one embodiment, the connector 82 and the antenna 46 are both disposed adjacent to the second surface 42 of the DUT 4b. The connector 82 is electrically connected to the substrate 43, and is used for external connection.

Figure 28:
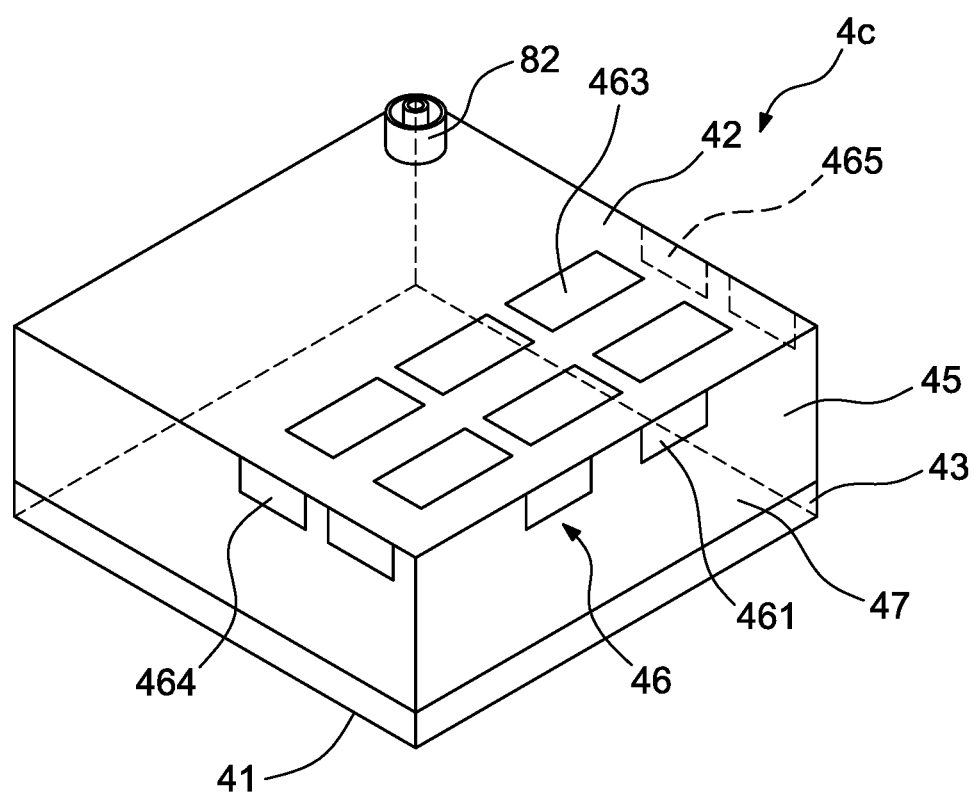
FIG. 28 illustrates a bottom perspective view of a DUT according to some embodiments of the present disclosure.

FIG. 28 illustrates a bottom perspective view of a DUT 4c according to some embodiments of the present disclosure. The DUT 4c of FIG. 28 is similar to the DUT 4b of FIG. 27, except that the second radiation source/receiver 462 of the antenna 46 is omitted, and the third radiation source/receiver 463, the fourth radiation source/receiver 464 and the fifth radiation source/receiver 465 are disposed on the right portion of the DUT 4c. It is noted the connector 82 is disposed on the left portion of the DUT 4c. Thus, the connector 82 and the antenna 46 (including, for example, the first radiation source/receiver 461, the third radiation source/receiver 463, the fourth radiation source/receiver 464 and the fifth radiation source/receiver 465) are disposed on the different portions of the DUT 4c.

Figure 29:
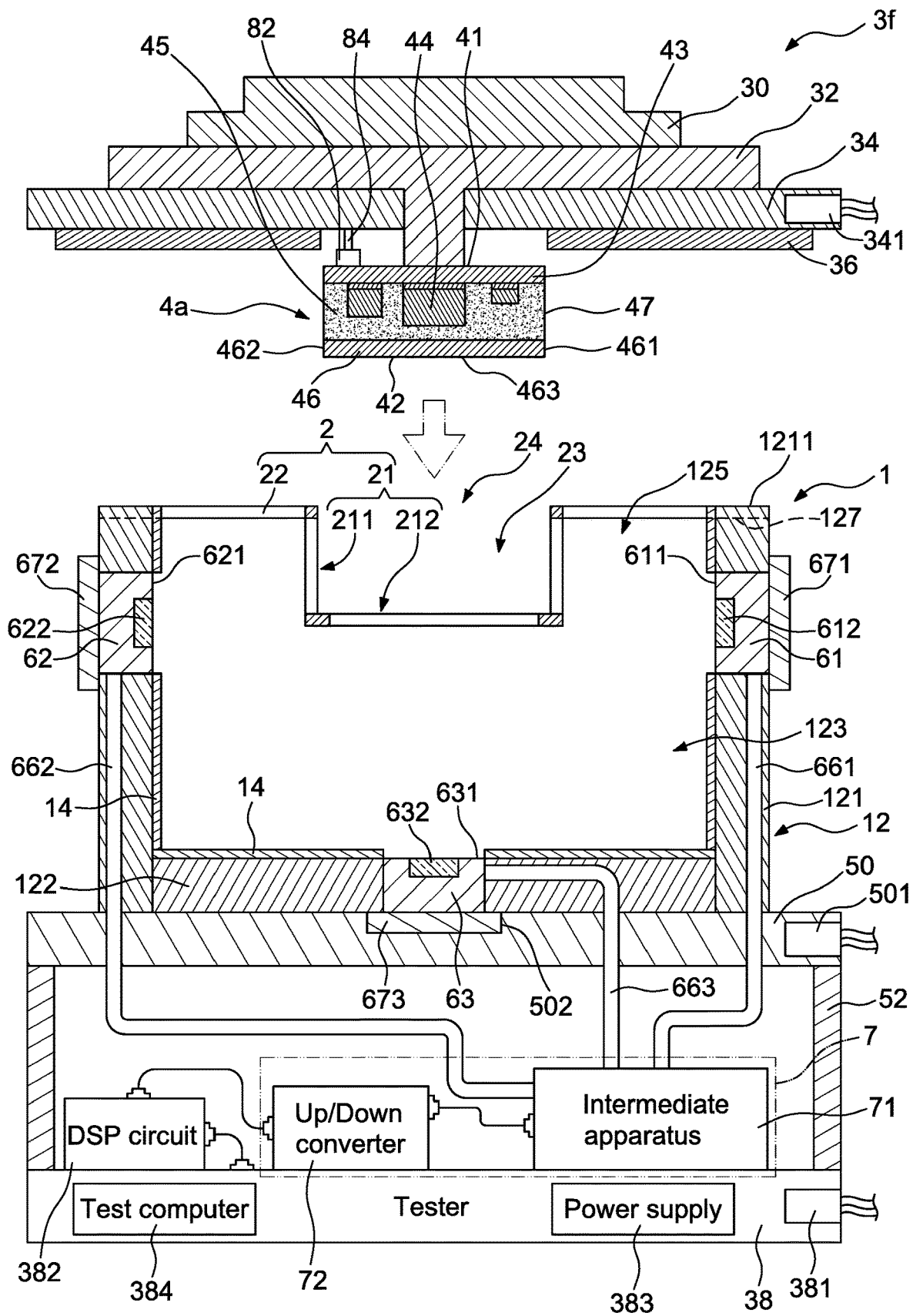
FIG. 29 illustrates a cross-sectional view of a testing system according to some embodiments of the present disclosure.

FIG. 29 illustrates a cross-sectional view of a testing system 3f according to some embodiments of the present disclosure. The testing system 3f of FIG. 29 is similar to the testing system 3 of FIG. 9 and FIG. 12, and the differences are described as follows. In the testing system 3f, the DUT 4a (FIG. 26) replaces the DUT 4 of FIG. 9 and FIG. 12. In addition, the connecting socket 35 and the testing probes 351 are omitted. As shown in FIG. 29, the testing system 3f further includes an electrical connecting element 84. The electrical connecting element 84 is electrically connected to the top circuit board 34 (e.g., a test board). During a testing method, the electrical connecting element 84 is inserted into or engaged with the connector 82 of the DUT 4a. Thus, the top circuit board 34 (e.g., a test board) is electrically connected to the DUT 4a through the electrical connecting element 84 and the connector 82.

Figure 30:
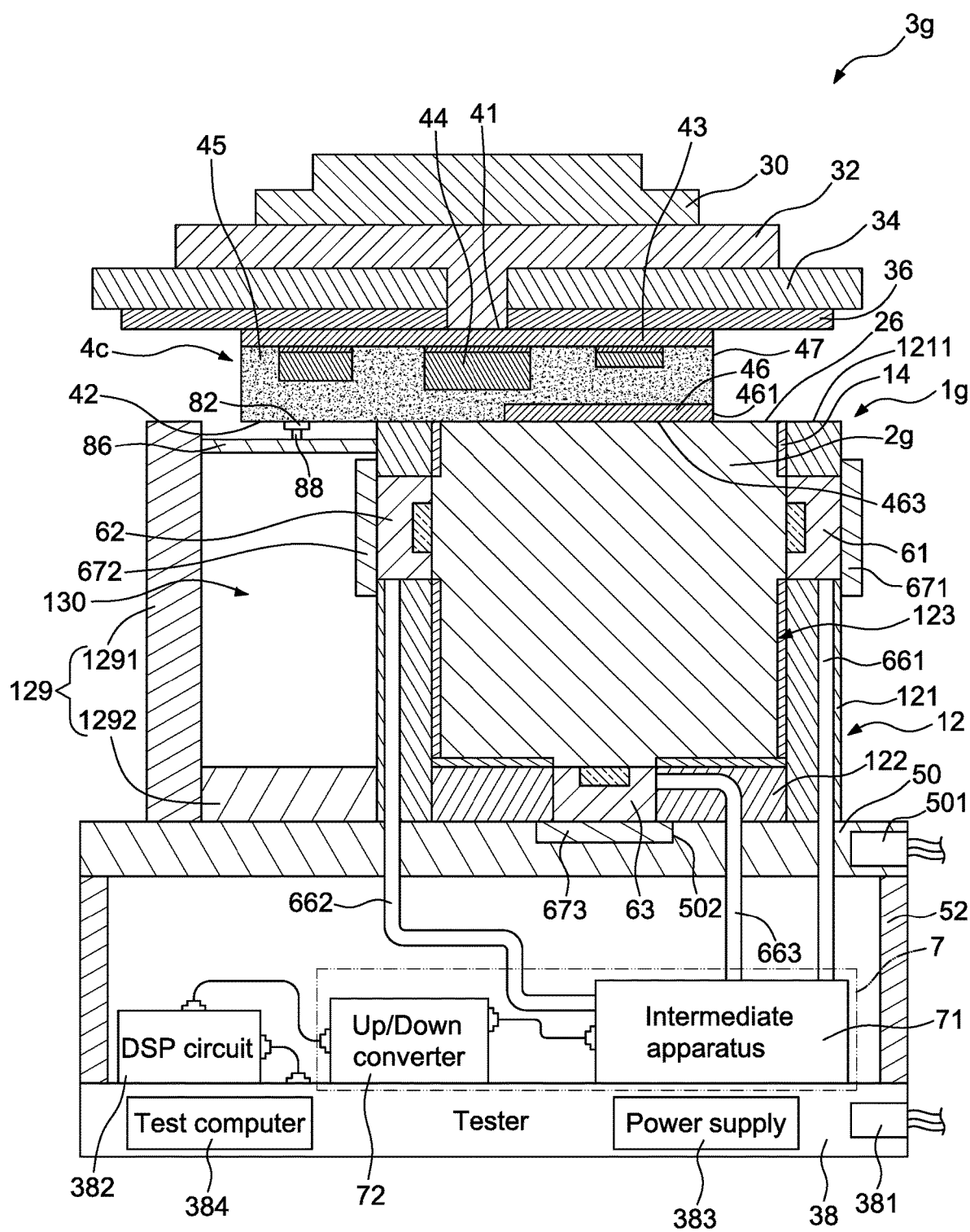
FIG. 30 illustrates a cross-sectional view of a testing system according to some embodiments of the present disclosure.

FIG. 30 illustrates a cross-sectional view of a testing system 3g according to some embodiments of the present disclosure. The testing system 3g of FIG. 30 is similar to the testing system 3e of FIG. 25, and the differences are described as follows. In the testing system 3g, the DUT 4c (FIG. 28) replaces the DUT 4 of FIG. 25. In addition, the connecting socket 35 and the testing probes 351 are omitted. As shown in FIG. 30, the testing system 3g further includes an additional testing socket 129, a conversion board 86 and an electrical connecting element 88. The additional testing socket 129 includes one or more side walls 1291 (e.g. three side walls 1291) and a bottom wall 1292. The additional testing socket 129 is attached to a side wall 121 of the testing socket 12 so as to define an accommodating space 130. That is, the three side walls 1291 and the bottom wall 1292 of the additional testing socket 129 and one side wall 121 of the testing socket 12 together define the accommodating space 130. The conversion board 86 is disposed on a top portion of the accommodating space 130 of the additional testing socket 129. That is, the conversion board 86 is disposed outside the testing socket 12. In one embodiment, the accommodating space 130 may be empty, and the conversion board 86 is fixed to the side wall 121 of the testing socket 12 and the side walls 1291 of the additional testing socket 129. In one embodiment, the accommodating space 130 may be filled with a filling material, and the conversion board 86 is disposed on the filling material. In addition, the electrical connecting element 88 is electrically connected to the conversion board 86. During a testing method, the electrical connecting element 88 is inserted into or engaged with the connector 82 of the DUT 4c. Thus, the conversion board 86 is electrically connected to the DUT 4c through the electrical connecting element 88 and the connector 82. Further, the conversion board 86 is electrically connected to the bottom circuit board 50 (e.g., a load board) and/or the tester 38. Thus, the top circuit board 34 (e.g., a test board) may be omitted.

As shown in FIG. 30, the device holder 2g of the testing device 1g fills the radiation space 123 defined by the absorber 14 of the testing socket 12. The device holder 2g has an upper surface 26 that is substantially coplanar with the upper surfaces 1211 of the side walls 121 of the testing socket 12. During a testing method, the second surface 42 of the DUT 4c may contact the upper surface 26 of the device holder 2g and the upper surfaces 1211 of the side walls 121 of the testing socket 12.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A testing device, comprising:
a testing socket defining a radiation space;
a first transmission medium disposed in the radiation space, wherein the first transmission medium is configured for supporting a device under test (DUT); and
a second transmission medium disposed in the radiation space, wherein the first transmission medium includes a device holder, the device holder defines an accommodating space for receiving the device under test (DUT), and a portion of the device holder is interposed between the device under test (DUT) and the testing socket.

2. The testing device of claim 1, wherein the second transmission medium is air.

3. The testing device of claim 1, wherein the device holder further defines at least one opening to expose at least a portion of an antenna of the device under test (DUT).

4. The testing device of claim 3, further comprising an air flow flowing from a bottom of the testing socket to the device holder.

5. The testing device of claim 4, wherein the testing socket defines at least one air vent at a bottom portion thereof, and the air flow flows through the air vent.

6. The testing device of claim 1, wherein a portion of the device holder extends to a bottom portion of the testing socket.

7. The testing device of claim 1, wherein the device holder extends adjacent to an inner surface of the testing socket.

8. The testing device of claim 1, further comprising an absorber disposed on an inner surface of the testing socket.

9. The testing device of claim 8, wherein the device holder contacts the absorber.

10. The testing device of claim 1, wherein the device holder further defines a plurality of openings to expose a plurality of portions of an antenna of the device under test (DUT).

11. The testing device of claim 1, wherein the device holder is detachably attached to the testing socket.

12. The testing device of claim 1, wherein the device holder includes an extending portion, and the testing socket defines a slot for receiving the extending portion of the device holder.

13. The testing device of claim 1, wherein a gap is defined between the device holder and a lateral surface of the device under test (DUT).

14. The testing device of claim 1, wherein a dielectric constant (Dk) of the first transmission medium is different from a dielectric constant (Dk) of the second transmission medium.

15. The testing device of claim 1, further comprising a conversion board disposed outside the testing socket, wherein the device under test (DUT) is electrically connected to the conversion board.

16. A testing device, comprising:
a testing socket having an inner surface defining a radiation space, wherein the inner surface of the testing socket is a wave absorbing surface; and
a device holder disposed in the radiation space, wherein the device holder defines an accommodating space for receiving a device under test (DUT), the device holder is detachably attached to the testing socket, and a portion of the device holder is interposed between the device under test (DUT) and the testing socket.

17. The testing device of claim 16, wherein the device under test (DUT) includes at least one radiation source, and the testing device further comprises at least one measurement module attached to the testing socket, wherein the measurement module corresponds to the radiation source.

18. The testing device of claim 17, wherein the device under test (DUT) includes a first radiation source, a second radiation source and a third radiation source, the testing device comprises a first measurement module for receiving a radio frequency signal from the first radiation source, a second measurement module for receiving a radio frequency signal from the second radiation source and a third measurement module for receiving a radio frequency signal from the third radiation source.

19. The testing device of claim 17, wherein the measurement module includes a waveguide, a probe and an antenna.

20. The testing device of claim 17, wherein the device holder further defines at least one opening to expose the radiation source of the device under test (DUT).

21. The testing device of claim 16, wherein a portion of the device holder extends to a bottom portion of the testing socket.

22. The testing device of claim 16, wherein the device holder fills the radiation space of the testing socket.

23. The testing device of claim 22, further comprising an absorber disposed on the inner surface of the testing socket, and the device holder contacts the absorber.

24. The testing device of claim 16, wherein the device holder is formed by injection molding.

25. A testing system, comprising:
a testing device, comprising:
a testing socket defining a radiation space;
a first transmission medium disposed in the radiation space, wherein the first transmission medium is configured for supporting a device under test (DUT), the first transmission medium comprises a device holder, the device holder defines an accommodating space for receiving the device under test (DUT), and a portion of the device holder is interposed between the device under test (DUT) and the testing socket; and
a second transmission medium disposed in the radiation space;
a circuit board disposed above the testing socket and configured to electrically connect to the DUT;
a tester disposed under the testing socket and electrically connected to the circuit board; and
a sub-system, comprising:
an intermediate apparatus being in communication with the device under test (DUT); and
an up/down converter electrically connected to the intermediate apparatus and the tester, wherein the up/down converter is configured for lowering or raising a frequency of a signal.

26. The testing system of claim 25, wherein the device under test (DUT) includes at least one radiation source, and the testing device further comprises at least one measurement module attached to the testing socket, wherein the measurement module corresponds to the radiation source, and the intermediate apparatus is in communication with the radiation source of the device under test (DUT) through the measurement module.

27. The testing system of claim 25, wherein the intermediate apparatus includes a plurality of input ports, a switch control circuit and an output port, the input ports are in communication with the device under test (DUT), the output port is electrically connected to the up/down converter, and a single one of the input ports is electrically connected to the output port through the control of the switch control circuit.

28. The testing system of claim 25, wherein the intermediate apparatus includes a plurality of input ports, a power combiner circuit and an output port, the input ports are in communication with the device under test (DUT), the output port is electrically connected to the up/down converter, and all of the input ports are electrically connected to the output port through the power combiner circuit.

29. The testing device of claim 25, wherein the device holder further defines a plurality of openings to expose a plurality of portions of an antenna of the device under test (DUT).

30. The testing device of claim 25, wherein the device holder is detachably attached to the testing socket.

31. The testing device of claim 25, wherein the device holder includes an extending portion, and the testing socket defines a slot for receiving the extending portion of the device holder.

32. The testing device of claim 25, wherein a gap is defined between the device holder and a lateral surface of the device under test (DUT).

* * * * *